(12) United States Patent  (10) Patent No.: US 8,040,483 B2
Shiomi et al.  (45) Date of Patent: Oct. 18, 2011

(54) SEMICONDUCTOR DEVICE, DISPLAY DEVICE AND MOBILE DEVICE

(75) Inventors: Takeshi Shiomi, Nara (JP); Hiroshi Iwata, Nara (JP); Shuji Wakaiki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 253 days.

(21) Appl. No.: 12/259,418

(22) Filed: Oct. 28, 2008

(65) Prior Publication Data

US 2009/0127561 A1 May 21, 2009

(30) Foreign Application Priority Data

Nov. 15, 2007 (JP) ................................. 2007-297047

(51) Int. Cl.
*G02F 1/1345* (2006.01)
*H01L 29/786* (2006.01)
(52) U.S. Cl. ........................... 349/152; 349/110; 257/66
(58) Field of Classification Search .................. None
See application file for complete search history.

(56) References Cited

U.S. PATENT DOCUMENTS

2002/0070912 A1* 6/2002 Asuma et al. .................. 345/92
2005/0167668 A1* 8/2005 Korenari et al. ................ 257/67

FOREIGN PATENT DOCUMENTS

| GB | 2 364 823 A | 2/2002 |
| GB | 2 364 826 A | 2/2002 |
| JP | 11-72611 | 3/1999 |
| JP | 2000-22094 | 1/2000 |
| JP | 2000-155313 | 6/2000 |
| JP | 2000-356788 | 12/2000 |
| JP | 2001-290145 | 10/2001 |
| JP | 2002-110829 A | 4/2002 |
| JP | 2003-66427 | 3/2003 |
| JP | 2004-252333 | 9/2004 |
| JP | 2005-43810 | 2/2005 |
| JP | 2006-72060 | 3/2006 |
| JP | 2006-154317 | 6/2006 |
| JP | 2007-78776 | 3/2007 |
| JP | 2007-140310 | 6/2007 |
| JP | 2009276388 A * | 11/2009 |

* cited by examiner

*Primary Examiner* — Sarah Hahm
(74) *Attorney, Agent, or Firm* — Birch, Stewart, Kolasch & Birch, LLP

(57) ABSTRACT

A semiconductor device of the present invention includes an insulating substrate, a nonvolatile memory formed above the insulating substrate and having a memory holding portion, and at least one light-shielding body covering an upper side, an under side, or both sides of the memory holding portion, wherein at least one of the light-shielding bodies is installed in such a way that a protrusion degree of the light-shielding body, which is defined by (a length of the light-shielding body protruded from the memory holding portion)/(a distance between the light-shielding body and the memory holding portion), is 0.1 or more.

24 Claims, 13 Drawing Sheets

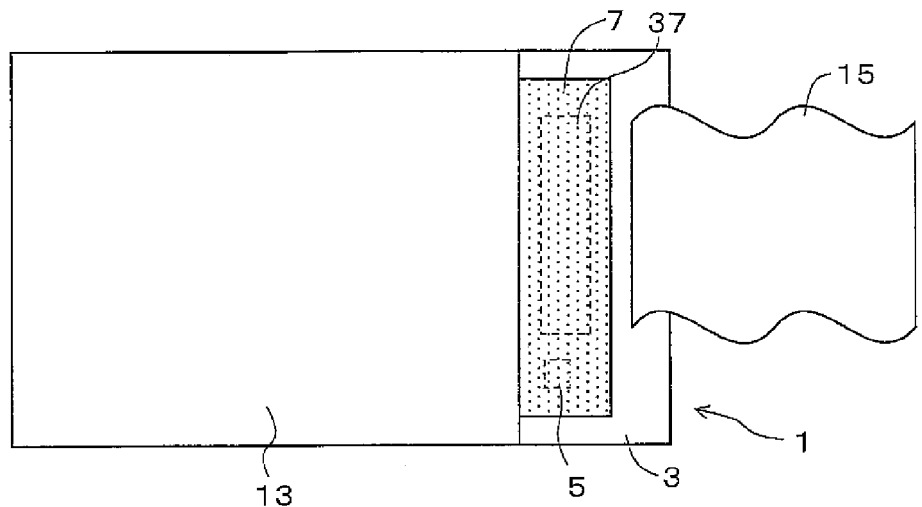
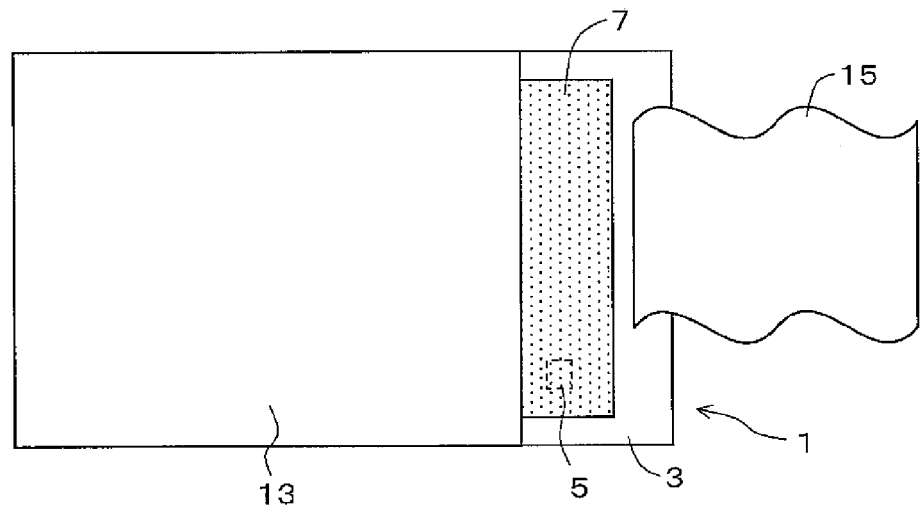
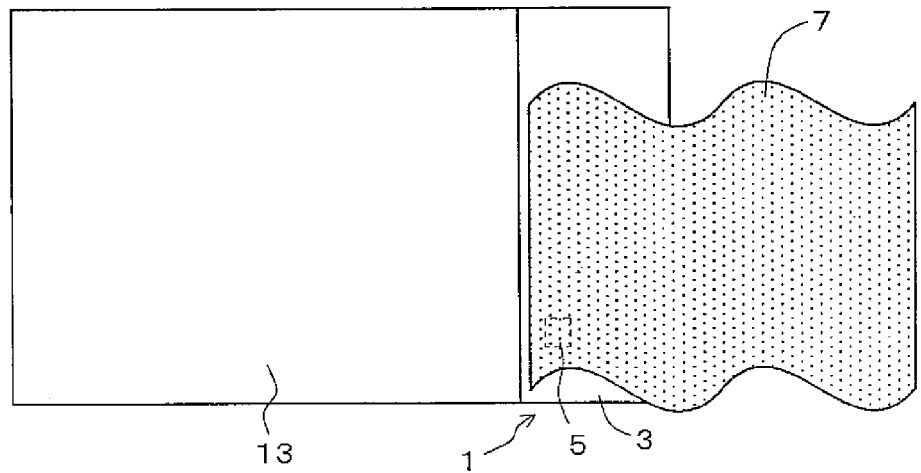

SEMICONDUCTOR DEVICE, DISPLAY DEVICE AND MOBILE DEVICE

CROSS-REFERENCE TO RELATED APPLICATION

This application is related to Japanese Patent Application No. 2007-297047 filed on Nov. 15, 2007, whose priority is claimed under 35 USC §119, and the disclosure of which is incorporated by reference in its entirety.

BACKGROUND OF THE INVENTION

1. Field of the Invention

The present invention relates to a semiconductor device having a nonvolatile memory, a display device (a liquid crystal display, an organic EL display, etc.) using this semiconductor device, and a mobile device (a laptop computer, a cell-phone, a handheld terminal, etc.).

2. Description of the Related Art

A method for improving functions of a TFT device formed on an insulating substrate, by providing the device with a nonvolatile memory function, has attracted attention.

As the method for improving the functions of the TFT device described above, Japanese Unexamined Patent Publication No. 2002-110829 discloses the following method. This method will be described with reference to FIG. 22.

Japanese Unexamined Patent Publication No. 2002-110829 discloses that a TFT memory 90 includes a polysilicon layer 92 having regions of a source 92a, a channel 92b, and a drain 92c, respectively formed on a substrate 91, and gate oxide films (insulating films) 93, 95 formed on this polysilicon layer 92, and these gate oxide films 93, 95 contain a plurality of granular silicon particles 94 which capture charges of carriers.

However, it was found out to be difficult to be used as a display device by the method for capturing charges in a plurality of silicon particles.

Specifically, when the TFT memory is used as a display device, illumination such as a backlight or the like is needed. It was found out that, when this illuminating light is applied to the silicon particles, charges captured in the silicon particles are activated and thereby the charges escape out of the silicon particles. That is, it was found that in the case of the display device employing an illuminating light, charges cannot be held by capturing the charges in silicon particles.

So, experiments were performed using other charge holding films instead of the silicon particles and further using various memory holding films irrespective of the charge holding film, but these attempts have not lead to the solution of above-mentioned problem.

SUMMARY OF THE INVENTION

In view of the above state of the art, it is an object of the present invention to provide a semiconductor device having a nonvolatile memory capable of prevent memory information from being lost when light is irradiated.

The semiconductor device of the present invention includes an insulating substrate, a nonvolatile memory formed above the insulating substrate and having a memory holding portion, and at least one light-shielding body covering an upper side, an under side, or both sides of the memory holding portion, wherein at least one of the light-shielding bodies is installed in such a way that a protrusion degree of the light-shielding body, which is defined by (a length of the light-shielding body protruded from the memory holding portion)/(a distance between the light-shielding body and the memory holding portion), is 0.1 or more.

The present inventors have first found that by installing at least one light-shielding body on the upper side, the under side, or the both sides of the memory holding portion of the nonvolatile memory, it is possible to prevent memory information from being lost when light is irradiated. Furthermore, the present inventors have found experimentally that an effect of installing the light-shielding body is outstandingly improved by installing the light-shielding body in such a way that the protrusion degree is 0.1 or more, and thus completed the present invention.

BRIEF DESCRIPTION OF THE DRAWINGS

FIGS. 4A and 4B are respectively a plan view and a backside view, and FIG. 4C is a sectional view taken on line I-I of FIG. 4A, and in FIG. 4B, a backlight module is omitted for convenience of illustration;

FIG. 5 is a plan view showing another structure of the display device of the second embodiment of the present invention and corresponding to FIG. 4A;

FIG. 6 is a plan view showing a structure of a display device of a third embodiment of the present invention and corresponding to FIG. 4A;

FIG. 7 is a plan view showing the structure of the display device of the third embodiment of the present invention and corresponding to FIG. 4A;

FIG. 8A is a plan view corresponding to FIG. 4A, and FIG. 8B is a sectional view taken on line I-I of FIG. 8A.

DESCRIPTION OF PREFERRED EMBODIMENTS

Figure 1:
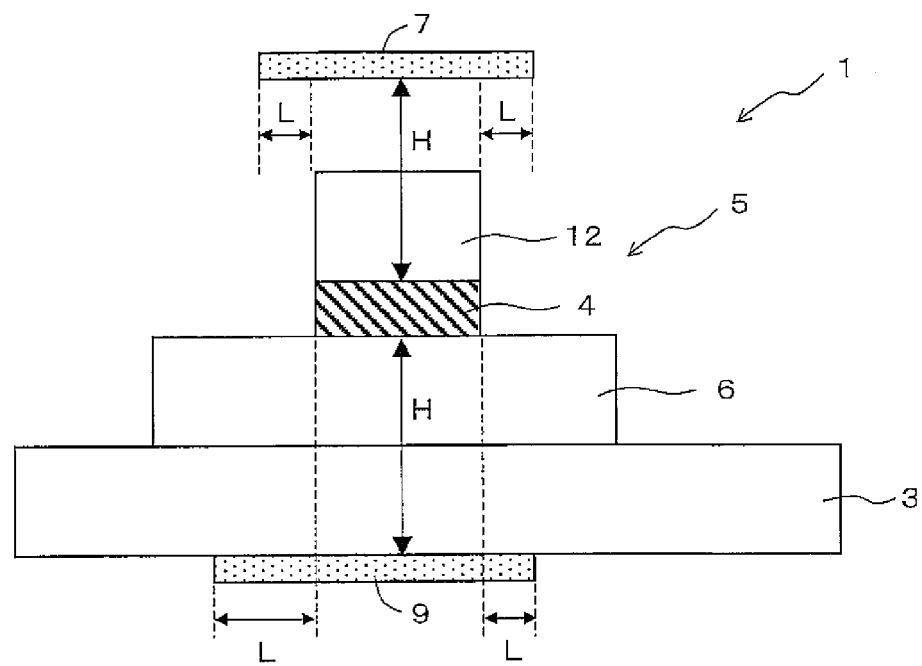
FIG. 1 is a sectional view showing a structure of a semiconductor device of a first embodiment of the present invention.

Hereinafter, various embodiments of the present invention will be exemplified.

The light-shielding bodies may be respectively installed above and below the memory holding portion. In this case, it is possible to prevent memory information from being lost even when light is irradiated from either portion above or portion below the memory holding portion.

The light-shielding bodies installed above and below the memory holding portion may be installed in such a way that each protrusion degree of the light-shielding bodies is 0.1 or more. In this case, it is more possible to prevent reliably memory information from being lost.

At least one of the light-shielding bodies may be 3 nm to 1 mm in thickness. In this case, it is possible to secure a light-shielding property and inhibit an increase in overall thickness in commercializing the light-shielding body.

The nonvolatile memory may be of a charge holding type. It is difficult for the charge holding memory to maintain memory information in a situation in which light is irradiated. In such a memory, it is possible to hold memory information by blocking the light with the light-shielding body.

At least one of the light-shielding bodies may be formed of a tape or a sheet. Since the tape or sheet does not need expensive vacuum equipment or exposure equipment, this can be possible to be formed inexpensively and easily.

The semiconductor device of the present invention further includes a backlight module formed above or below the insulating substrate, wherein at least one of the light-shielding bodies may be formed of a tape or a sheet, and the light-shielding body formed of the tape or the sheet may be located between the insulating substrate and the backlight module. Thereby, it is possible to use a double-sided adhesive tape, with which the insulating substrate is bonded to the backlight module, as a light-shielding body of a memory, and the necessity of installing the light-shielding body separately is eliminated.

The semiconductor device of the present invention further includes a frame covering a region in which the memory holding portion is formed, the region being at least one of regions which are respectively located above and below the insulating substrate, wherein at least one of the light-shielding bodies may be formed of a tape or a sheet, and the light-shielding body formed of the tape or the sheet may be located between the insulating substrate and the frame. In this case, it is possible to use a double-sided adhesive tape, with which the insulating substrate is bonded to the frame, as a light-shielding body of a memory, and the necessity of installing the light-shielding body separately is eliminated.

The semiconductor device of the present invention further includes at least one of an electronic part and a distributing cable on the insulating substrate, wherein at least one of the light-shielding bodies may be formed of a tape or a sheet, and the light-shielding body formed of the tape or the sheet may extend continuously from a region above the memory holding portion to a region above at least one of the electronic part and the distributing cable. Thereby, an adhesive tape or sheet to be bonded onto the electronic part or distributing cable is extended to the memory, and the extended tape or sheet is pasted onto the memory, and therefore it is possible to use this tape or sheet as a light-shielding body of the memory, and the necessity of installing the light-shielding body separately can be eliminated.

The semiconductor device of the present invention further includes an opposed substrate which is located above or below the insulating substrate and located opposite to the insulating substrate, wherein at least one of the light-shielding bodies may be located on the opposed substrate. Thereby, the light-shielding body is formed on the opposed substrate to be bonded in advance, and when the opposed substrate is bonded to the insulating substrate, the light-shielding body is bonded necessarily, and therefore the necessity of bonding the light-shielding body separately can be eliminated.

At least one of the light-shielding bodies may be composed of a black matrix. In this case, the necessity of installing the light-shielding body separately can be eliminated.

At least one of the light-shielding bodies may be formed of a photosensitive resin. Thereby, the step of etching becomes unnecessary and it is possible to form the light-shielding body easily using photolithography or an ink-jet system as distinct from a light-shielding body using a metal film.

At least one of the light-shielding bodies may be formed by use of a coating material or a resin. Thereby, the light-shielding body can be easily formed at the bottom of a depression of projections and depressions.

The coating material or resin may include a silicon resin. Thereby, permeation of water can be inhibited.

At least one of the light-shielding bodies includes a black pigment, and the black pigment may include at least one selected from the group consisting of carbon black, graphite, copper oxide, manganese dioxide, aniline black, perylene black, titanium black, cyanine black, activated carbon, ferrite, magnetite, chromium oxide, iron oxide, molybdenum disulfide, chromium complex, composite oxide base black dye and anthraquinone base organic black dye. Thereby, it is possible to reduce the transmittance of the light-shielding body.

At least one of the light-shielding bodies may be composed of an electronic part, a distributing cable or an electronic part-mounting board. In this case, these conventionally needed constituent elements can be used as a light-shielding body.

At least one of the light-shielding bodies may be composed of a frame covering a region, in which the memory holding portion is formed, the region being at least one of regions which are respectively located above and below the insulating substrate. At least one of the light-shielding bodies may be composed of a frame surrounding a light-emitting part or a light-guide part of a backlight module. By placing the frame so as to be located above or below the memory like this, the frame can be used as a light-shielding body for the memory.

The nonvolatile memory may be contained in a case, and at least one of the light-shielding bodies may be composed of the case. By placing the case so as to be positioned above or below the memory like this, the case can be used as a light-shielding body for the memory.

At least one of the light-shielding bodies may have a structure in which a plurality of light-shielding bodies are stacked. By having the structure in which the plurality of light-shielding bodies are stacked, an effect of the light-shielding can be enhanced.

The semiconductor device of the present invention may further includes a TFT formed on the insulating substrate. Thereby, it is possible to form simultaneously the memory composing the semiconductor device and the TFT composing the display device and costs can be lowered.

The present invention also proves a display device (a liquid crystal display, an organic EL display, etc.) including the semiconductor device described above.

In the above-mentioned display device, gamma correction values or voltage correction values of an electrode of an opposed substrate may be stored in the nonvolatile memory. Thereby, it is possible to store data stored in an external memory portion in a substrate composing the display device. Accordingly, it is possible to reduce the component count of the external memory portion.

The present invention also proves a mobile device (a laptop computer, a cell-phone, a handheld terminal, etc.) including the display device described above. Thereby, by constructing a laptop computer or a cell-phone or a handheld terminal using a display device reducing the component count of the external memory portion, it is possible to make the mobile device low-profile or to reduce the weight of the mobile device.

Various embodiments shown here can be combined with one another.

Hereinafter, embodiments of the present invention will be described with reference to drawings. The contents shown in the drawings or described in the following embodiments are intended only to exemplify the present invention, and the scope of the present invention is not limited to these drawings or the descriptions in the following embodiments.

1. First Embodiment

A first embodiment of the present invention will describe different aspects of a semiconductor device 1 with reference to drawings. FIG. 1 is a sectional view showing a structure of the semiconductor device 1 of the first embodiment.

The semiconductor device 1 of the first embodiment includes an insulating substrate 3, a nonvolatile memory 5 formed above the insulating substrate 3 and having a memory holding portion 4, and at least one light-shielding body covering an upper side, an under side, or both sides of the memory holding portion 4, wherein at least one of the light-shielding bodies is installed in such a way that a protrusion degree of the light-shielding body, which is defined by (a length of the light-shielding body protruded from the memory holding portion 4)/(a distance between the light-shielding body and the memory holding portion 4), is 0.1 or more.

In the first embodiment, the light-shielding bodies are respectively installed above and below the memory holding portion 4. Hereinafter, the light-shielding body installed above the memory holding portion 4 is referred to as an upper light-shielding body 7, and the light-shielding body installed below the memory holding portion 4 is referred to as a lower light-shielding body 9. In addition, one of the upper light-shielding body 7 and the lower light-shielding body 9 can be omitted.

In the first embodiment, both the light-shielding bodies 7 and 9 are installed in such a way that each protrusion degree of the light-shielding bodies 7 and 9 is 0.1 or more. However, one of the light-shielding bodies 7 and 9 may have a degree of a protrusion of less than 0.1.

Hereinafter, constituent elements of the semiconductor device 1 will be described.

1-1. Insulating Substrate

The insulating substrate 3 is a substrate having an insulation property, and it is preferable to be transparent. A reason why the transparent insulating substrate 3 is preferable is that light can pass through the transparent insulating substrate 3 and images can be displayed by use of the light passing therethrough when the insulating substrate 3 is used as a substrate composing a display. When the insulating substrate 3 is transparent, however, the necessity of shielding a region, where the light is not desired to pass through, increases. Another reason why the transparent insulating substrate 3 is preferable is that in a liquid crystal panel module, light from a backlight module can pass through the transparent insulating substrate 3. The insulating substrate 3 is, for example, a glass substrate, or a plastic substrate such as an acrylic or polycarbonate resin, a polysulfone resin, a polymethyl pentene resin, a polyallylate resin, a polyimide resin, or a phenolic resin. Further, a desired region of the insulating substrate 3 may be opaque, and this insulating substrate 3 can be used as a lower light-shielding body.

1-2. Nonvolatile Memory

The nonvolatile memory 5 is formed above the insulating substrate 3. The memory 5 has the memory holding portion 4. In FIG. 1 as an example, the memory 5 includes a semiconductor layer 6, the memory holding portion 4, and a gate electrode 12 in this order on the insulating substrate 3. In the semiconductor layer 6, a channel region is formed immediately below the gate electrode 12, and source/drain regions are formed on both sides of the channel region. The memory 5 is an MONOS-type memory, and the memory holding portion 4 has a three-layer structure in which a silicon nitride film is sandwiched between silicon oxide films.

A structure of the memory 5 is not particularly limited as long as the memory 5 has the memory holding portion 4.

Figure 2:
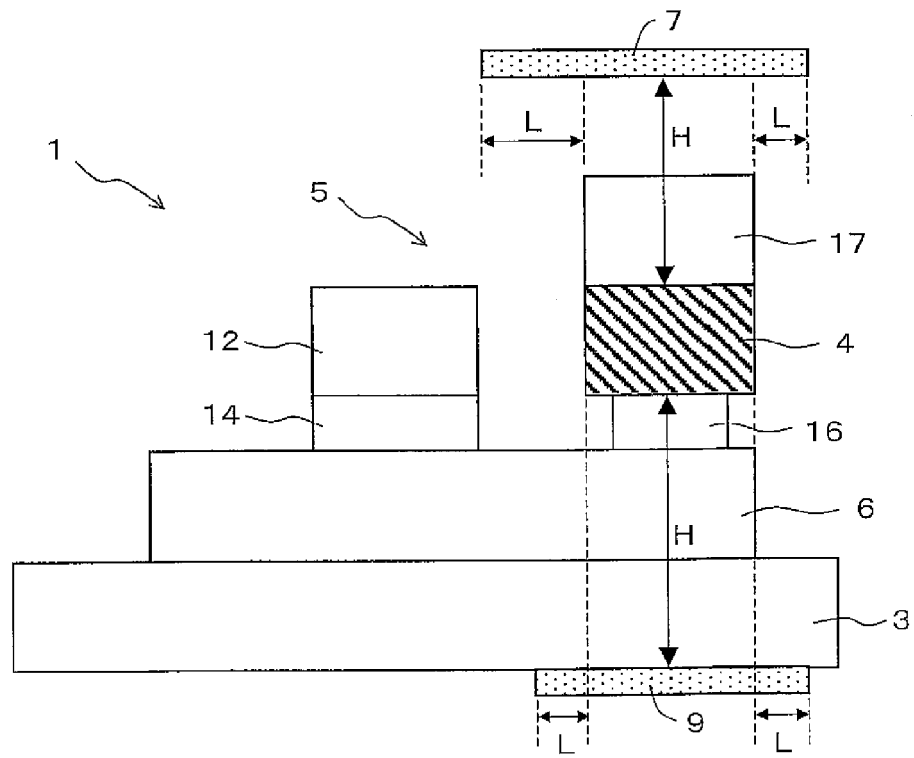
FIG. 2 is a sectional view showing another structure of the semiconductor device of the first embodiment of the present invention.

FIG. 2 is a sectional view showing a structure of a semiconductor device 1.

FIG. 2 shows a structure of the memory 5 such that the gate electrode 12 is spatially separated from the memory holding portion 4. In a constitution of FIG. 2, the memory 5 has on an insulating substrate 3 a semiconductor layer 6, a gate insulating film 14, the gate electrode 12, a wiring portion or lower electrode portion 16, the memory holding portion 4, and a wiring portion or upper electrode portion 17. In the semiconductor layer 6, a channel region is formed immediately below the gate electrode 12, and source/drain regions are formed on both sides of the channel region. The source region or the drain region is electrically connected to the wiring portion 16. An FeRAM, a PRAM, an RRAM and an MRAM to be hereinafter described generally have the constitution of FIG. 2. In either of the constitutions of FIGS. 1 and 2, a problem of losing memory information may arise if the memory holding portion 4 is irradiated with light, and therefore the memory holding portion 4 needs to be covered with the light-shielding bodies 7 and 9. Further, it is desirable that an insulating film, although not shown in FIGS. 1 and 2, is formed between the light-shielding body 7 and the wiring portion or upper electrode portion 17. By forming this insulating film, it is possible to form a wire on the insulating film, and to improve flexibility of a design of the semiconductor device 1. Furthermore, by forming another insulating film on the wire so as to use the insulating film as a protective film, it is possible to protect the memory and other elements formed above the insulating substrate.

In the present invention, the nonvolatile memory 5 refers to a memory which can hold memory information longer than a DRAM, and holding time thereof is 1 hour or more. The holding time for holding the memory information is preferably 1 day or more, 1 week or more, 1 month or more, 1 year or more, or 10 years or more. Ideally, the holding time is 10 years or more. However, there may be some cases, depending on how the semiconductor device 1 is used, where the holding time can be less than 1 year without causing any problem. Furthermore, even though the memory has a capacity for holding the memory information for about 1 day or 1 hour, it is possible to hold the memory information for a longer time by performing a refresh operation, such as additional writing, as needed.

Types of the memory 5 are not particularly limited, and the memory 5 can be any one of charge holding memories, memories (e.g., an FeRAM) using a ferroelectric, memories (e.g., an MRAM) using a magnetic material, memories (e.g., a PRAM, an RRAM) treating resistance as holding information, and memories using a carbon nano tube. A reason why the types of the memory 5 are not limited is that a problem, such that memory information is lost by being irradiated with light or memory information cannot be read normally due to a noise current, could arise even though any type of the memory 5 above is used.

It is preferable that the memory 5 is of the charge holding type. A reason why the memory 5 of the charge holding type is preferable is that since the charge holding memory is apt to cause the problem such that the memory information is lost by being irradiated with the light or the memory information cannot be read normally due to the noise current, an advantage of blocking the light with the light-shielding bodies 7 and 9 is particularly large. Examples of the charge holding nonvolatile memory include an EPROM, an EEPROM, or a flash memory, which uses a floating gate as a charge accumulation layer, an MONOS or an SONOS which uses a silicon nitride film as a charge holding film, and a nanodot memory which holds charges in particles of silicon or metal.

1-3. Upper Light-Shielding Body and Lower Light-Shielding Body

The upper light-shielding body 7 and the lower light-shielding body 9 respectively cover the upper side and the under side of the memory holding portion 4. The upper light-shielding body 7 blocks, for example, light of interior illumination or solar light, and the lower light-shielding body 9 blocks, for example, light from the backlight module. This is one example at the time when the memory 5 is used as a part, and there may be cases where the orientation of installation of parts is reversed between a front side and a back side at a design stage. Therefore, solar light may be irradiated from beneath the memory 5 and backlight may be irradiated from above the memory 5.

At least one of the light-shielding bodies 7 and 9 is installed in such a way that a protrusion degree of the light-shielding body, which is defined by (a length L of the light-shielding bodies 7 and/or 9 protruded from the memory holding portion 4)/(a distance H between the light-shielding bodies 7 and/or 9 and the memory holding portion 4), is 0.1 or more. It was experimentally verified that an effect of installing the light-shielding bodies 7 and 9 is outstandingly improved by installing at least one of the light-shielding bodies 7 and 9 in this manner. The protrusion degree is not limited and is basically preferable to be large. However, the protrusion degree is preferably 100 or less considering downsizing, reduction in weight and narrowing of a frame. The protrusion degree is, for example, 0.1 to 10000, and specifically, for example, 0.1, 0.5, 1, 2, 3, 4, 5, 10, 50, 100, 1000, and 10000. The protrusion degree may have a value between any adjacent two values of numerical values described above. In addition, when the protrusion degrees of the light-shielding bodies 7 and 9 differ between the right side and the left side of the memory holding portion 4 like the lower light-shielding body 9 in FIG. 1 and the upper light-shielding body 7 in FIG. 2, the protrusion degrees of a smaller value corresponds "the protrusion degree" of the present invention.

Structures of the light-shielding bodies 7 and 9 are not particularly limited as long as they can attenuate the intensity of light applied to the memory holding portion 4. The light-shielding bodies 7 and 9 are preferable to have an average light transmittance of 50% or less at a wavelength of 300 to 700 nm, and more preferable to have 40% or less, 30% or less, 20% or less, 10% or less, 5% or less, 1% or less, or 0.1% or less. The most preferable transmittance is 0.01% or less. A reason why the low transmittance is preferable is that the light-shielding body can block light more effectively in an environment in which intense light is applied.

The light-shielding bodies 7 and 9 preferably include a light-shielding material. The light-shielding material is, for example, a black pigment, and the black pigment includes at least one selected from the group consisting of carbon black (furnace black, channel black, acetylene black, thermal black, lamp black, etc), graphite, copper oxide, manganese dioxide, aniline black, perylene black, titanium black, cyanine black, activated carbon, ferrite (non-magnetic ferrite, magnetic ferrite, etc.), magnetite, chromium oxide, iron oxide, molybdenum disulfilde, chromium complex, composite oxide base black dye, and anthraquinone base organic black dye.

Further, the light-shielding material may be a metal particle or a metal film. Examples of materials of the metal particle or the metal film include elements of Group 1 of the periodic table such as lithium, sodium, potassium, rubidium, cesium and the like; elements of Group 2 of the periodic table such as magnesium, calcium, strontium, barium and the like; elements of Group 3 of the periodic table such as scandium, yttrium, lanthanoid (lanthanum, cerium, etc.), actinoids (actinium, etc.) and the like; elements of Group 4 of the periodic table such as titanium, zirconium, hafnium and the like; elements of Group 5 of the periodic table such as vanadium, niobium, tantalum and the like; elements of Group 6 of the periodic table such as chromium, molybdenum, tungsten and the like; elements of Group 7 of the periodic table such as manganese, technetium, rhenium and the like; elements of Group 8 of the periodic table such as iron, ruthenium, osmium and the like; elements of Group 9 of the periodic table such as cobalt, rhodium, iridium and the like; elements of Group 10 of the periodic table such as nickel, palladium, platinum and the like; elements of Group 11 of the periodic table such as copper, silver, gold and the like; elements of Group 12 of the periodic table such as zinc, cadmium, mercury and the like; elements of Group 13 of the periodic table such as aluminum, gallium, indium, thallium and the like; elements of Group 14 of the periodic table such as tin, lead and the like; and elements of Group 15 of the periodic table such as antimony, bismuth and the like. On the other hand, examples of alloy include stainless steel, copper-nickel alloy, brass, nickel-chromium alloy, iron-nickel alloy, zinc-nickel alloy, gold-copper alloy, tin-lead alloy, silver-tin-lead alloy, nickel-chromium-iron alloy, copper-manganese-nickel alloy, and nickel-manganese-iron alloy.

Thicknesses of the light-shielding bodies 7 and 9 are not particularly limited, but they are preferably 3 nm to 1 mm or less. A reason why the thicknesses of the light-shielding bodies 7 and 9 are preferably 3 nm to 1 mm or less is that, in this case, an increase in a thickness of the semiconductor device can be inhibited while securing an adequate light-shielding property. The thicknesses of the light-shielding bodies 7 and 9 are, for example, 3 nm, 5 nm, 10 nm, 20 nm, 50 nm, 100 nm, 1 μm, 5 μm, 10 μm, 50 μm, 0.1 mm, 0.2 mm, 0.3 mm, 0.4 mm, 0.5 mm, 0.6 mm, 0.7 mm, 0.8 mm, 0.9 mm, and 1 mm. The thicknesses of the light-shielding bodies 7 and 9 may be a value between any adjacent two values of numerical values described above. The thicknesses of the light-shielding bodies 7 and 9 may be the same as each other, or may be different from each other.

A method for forming the light-shielding bodies 7 and 9 is not particularly limited, and examples of the method include various methods such as pasting a tape or a sheet (hereinafter, referred to as "a tape or the like"), applying a coating material or a resin, containing a light-shielding material, etc. The method for forming the light-shielding body 7 may be the same as that of the light-shielding body 9, or may be different from that of the light-shielding body 9. For example, one of the light-shielding bodies 7 and 9 may be formed by pasting a tape or the like and the other light-shielding body may be formed by another method.

Further, the light-shielding bodies 7 and 9 may be formed in a display panel module, or may be formed outside the display panel module.

The display panel module refers to a module composed of the insulating substrate above which the memory holding portion 4 is formed, the opposed substrate bonded to the insulating substrate, the backlight module, the frame to protect the insulating substrate, the electronic part, and the distributing cable.

The light-shielding body formed in the display panel module means, for example, a light-shielding body formed in contact with a part composing the display panel module, a light-shielding body formed in a state of being sandwiched between any two parts of parts composing the display panel module (for example, between the backlight module and the insulating substrate, between the insulating substrate and the opposed substrate), or a light-shielding body composed of a part itself composing the display panel module. When the light-shielding body is formed in the display panel module, since the light-shielding body can perform light-shielding of the memory holding portion 4 at a position relatively close to the memory holding portion 4, there is an effect of being able to decrease the diffraction of light and the light-shielding body can perform efficient light-shielding.

The light-shielding body formed outside the display panel module refers to a light-shielding body composed of, for example, a part for fixing the display panel module or a case of equipment. In this case, since light can be blocked with the part or the case itself without adding a part newly, production cost can be reduced.

Further, it is also possible to install both of the light-shielding body formed in the display panel module and the light-shielding body formed outside the display panel module. In this case, a more effective light-shielding effect can be achieved.

(1) Case of Light-Shielding Body Formed of Tape or the Like

Here, the case where the light-shielding bodies 7 and 9 are formed of a tape or the like will be described in detail.

When the light-shielding bodies 7 and 9 are formed of the tape or the like, the light-shielding bodies 7 and 9 can be formed without the necessity of expensive vacuum equipment or exposure equipment and the formation of the light-shielding body is inexpensive and easy. Examples of a method for forming the light-shielding body include forming the light-shielding body using vacuum equipment in a CVD system or a sputtering system, or exposure equipment such as a stepper. However, in these methods, since equipment is expensive, cost of forming the light-shielding body becomes too high. But, in the case of forming the light-shielding body by pasting an adhesive tape, the light-shielding body can be formed at low cost and easily since expensive equipment is not needed.

Figure 3A:
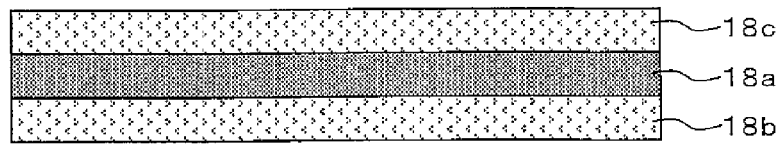
FIGS. 3A to 3E are sectional views showing a structure of a light-shielding body formed of a tape or a sheet used in the semiconductor device of the first embodiment of the present invention.
Figure 3B:
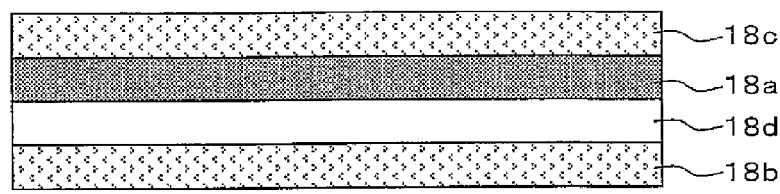
Figure 3C:
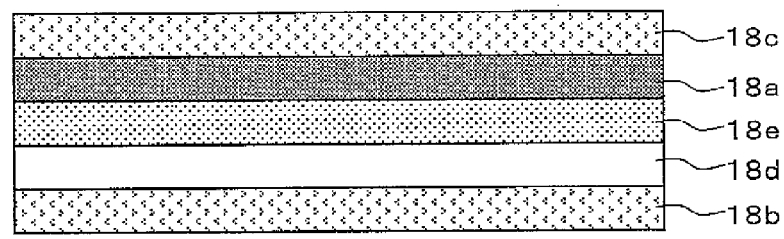

Here, the structures of the light-shielding bodies 7 and 9 formed of the tape or the like will be described using FIGS. 3A to 3E. The light-shielding bodies 7 and 9 may have any one of the structures shown in FIGS. 3A to 3E. Further, the structures of the light-shielding bodies 7 and 9 may be the same as each other or may be different from each other. FIGS. 3A to 3C indicate the case where the tape is a double-sided adhesive and FIGS. 3D to 3E indicate the case where the tape is a single-sided adhesive.

In the constitution of FIG. 3A, the light-shielding bodies 7 and 9 are composed of a black colored layer 18a, and a first adhesive layer 18b and a second adhesive layer 18c, which are installed on both sides of the black colored layer 18a.

In the constitution of FIG. 3B, a white colored layer 18d is installed between the black colored layer 18a and the first adhesive layer 18b. The tape or the like, having such a structure, is suitably used as the lower light-shielding body 9 located between a backlight module and the insulating substrate 3. By locating the tape or the like this in such a way that the black colored layer 18a is on the side of the insulating substrate 3 and the white colored layer 18d is on the side of the backlight module, light of the backlight module is reflected off the white colored layer 18d to reduce unnecessary absorption of light and thereby brightness is improved. By installing the black colored layer 18a on the memory 5, it is possible to absorb unnecessary diffracted light to prevent light from shining on the memory holding portion 4 of the memory 5 when the diffracted light is diffracted.

In the constitution of FIG. 3C, the light-shielding body has a metal layer 18e between the black colored layer 18a and the white colored layer 18d. The metal layer 18e is formed of, for example, aluminum. Since the metal layer 18e generally has a high light-shielding property, the whole thickness can be thinned.

Figure 3D:
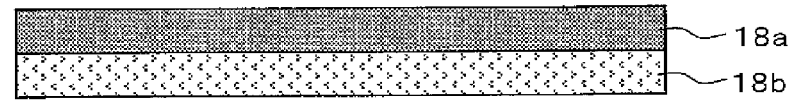
Figure 3E:
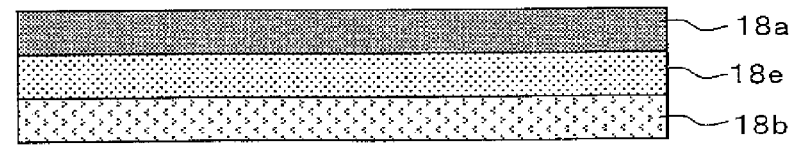

FIG. 3D shows a constitution in which the second adhesive layer 18c is eliminated from the constitution of FIG. 3A, and FIG. 3E shows a constitution in which the second adhesive layer 18c and the white colored layer 18d are eliminated from the constitution of FIG. 3C.

The black colored layer 18a is obtained, as an example, by coloring a transparent substrate such as polyethylene or polyester black. Alternatively, a substrate itself originally black colored can be used. Desirably, a thickness of the substrate is about 10 to 50 μm. The black colored layer 18a preferably contains a black pigment. Further, a layer containing a light-shielding material other than the black light-shielding material may be installed in place of the black colored layer 18a.

Various adhesive materials such as an acrylic pressure sensitive adhesive, rubber pressure sensitive adhesive, silicone pressure sensitive adhesive and the like can be used in the first adhesive layer 18b and the second adhesive layer 18c. Desirably, a thickness of the adhesive layer is about 20 μm. By coloring the adhesive layer itself black, an effect of light-shielding can also be enhanced.

The black colored layer 18a preferably contains a white pigment. Examples of the white pigment include titanium dioxide, zinc white, white lead and the like.

With respect to definitions of terms white color and black color, color can be expressed by chromaticity. The chromaticity can be expressed by L of L●a●b measured by a calorimeter. White color refers to color in which the chromaticity measured by a calorimeter is in the range of L of 80 or more and black color refers to color in which the chromaticity measured by a colorimeter is in the range of L of 40 or less.

(2) Case where the Light-Shielding Body is Formed by Applying a Coating Material or a Resin Containing a Light-Shielding Material The light-shielding bodies 7 and 9 may be formed, for example, by applying a coating material or a resin containing a light-shielding material.

A coating material to be used for forming the light-shielding bodies 7 and 9 is prepared by mixing, for example, the above-mentioned light-shielding material (for example, carbon black) in a solvent. The content of the light-shielding material is, for example, 0.1 to 10% by weight. The specific content of the light-shielding material is, for example, 0.1, 0.5, 1, 5, or 10% by weight. The content of the light-shielding material may be a value between any adjacent two values of numerical values described above. The light-shielding bodies 7 and 9 can be formed by moving a spray nozzle closer to the memory 5 and applying the coating material to the memory 5 by spraying. The coating material penetrates to a bottom corner of the step or a bottom of a depression since it is liquid immediately after spraying, and then is dried to become the light-shielding bodies 7 and 9. Consequently, it is possible to provide the coating material to the bottom corner of the step or the bottom of a depression, and therefore it is possible to easily form a light-shielding body at the bottom corner of the step or the bottom of a depression. Examples of the applying method include applying by an ink-jet system or with a brush.

Further, a resin to be used for forming the light-shielding bodies 7 and 9 is prepared by mixing, for example, the above-mentioned light-shielding material (for example, black pigments (e.g., carbon black)) and a solvent in a resin (e.g., silicon resin). The content of the light-shielding material is, for example, 0.1 to 30% by weight. The specific content of the light-shielding material is, for example, 0.1, 0.5, 1, 5, 10, 20, or 30% by weight. The content of the light-shielding material may be a value between any adjacent two values of numerical values described above. As the effects of forming the light-shielding body with a resin, there are an effect of protecting the memory 5 from external pressure since the formed light-shielding bodies 7 and 9 include a resin, an effect of enhancing chemical resistance, and an effect of improving moisture resistance and water resistance. Further, since the light-shielding body formed of a resin is liquid at first as with the coating material, it is possible to easily form a light-shielding body at the bottom corner of the step or in the depression. Examples of a method for forming a resin pattern to become these light-shielding bodies 7 and 9 include injecting a resin through a needle nozzle to put the resin on a memory portion, applying a resin by an ink-jet system or with a brush, and spraying a resin with a spray nozzle. Examples of the types of the resin include plastic polymers (polyamide resin, polyimide resin, urethane resin, silicon resin, phenoxy resin, etc.), thermosetting resins (epoxy resin, phenolic resin, polyimide resin, silicon resin), and acrylic resins. Further, a coupling agent, a diluent, a flame retarder, an antifoaming agent, a curing agent, a binder polymer, a pigment or filler may be added to the resin as needed. The coating material or resin preferably include a silicon resin. Thereby, permeation of water can be inhibited.

Figure 21:
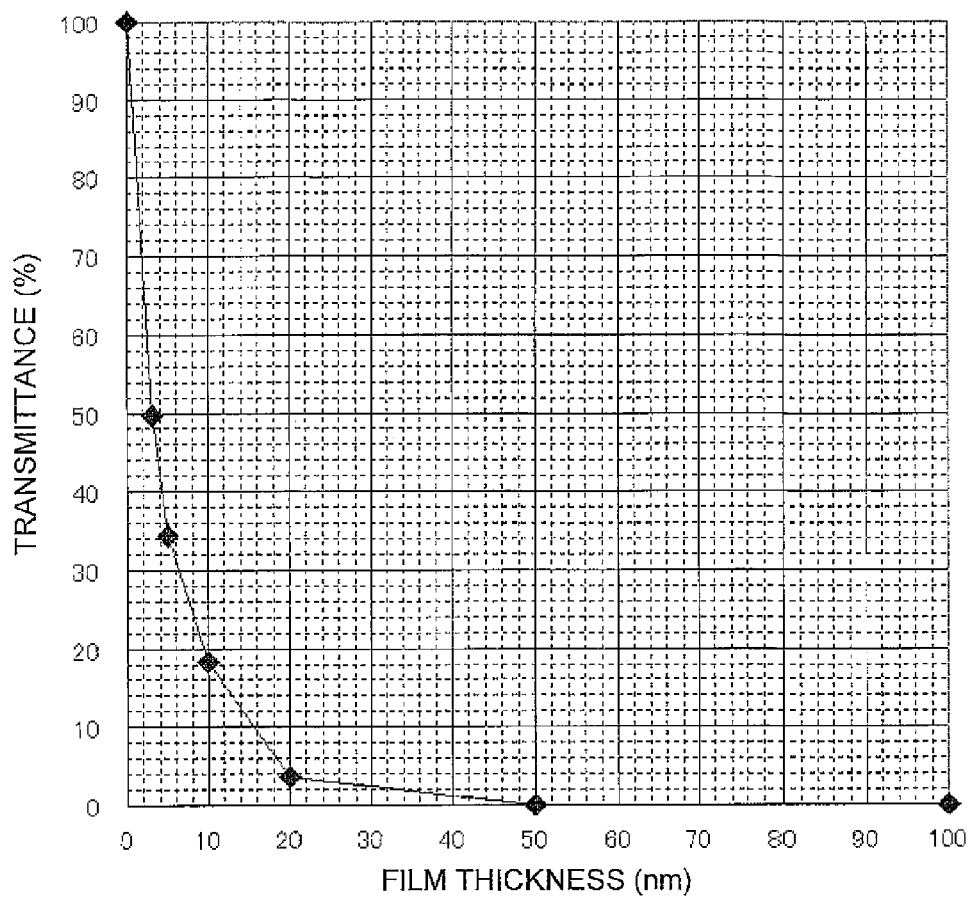
FIG. 21 is a graph showing a relationship between a film thickness and the transmittance of a light-shielding body.
Figure 22:
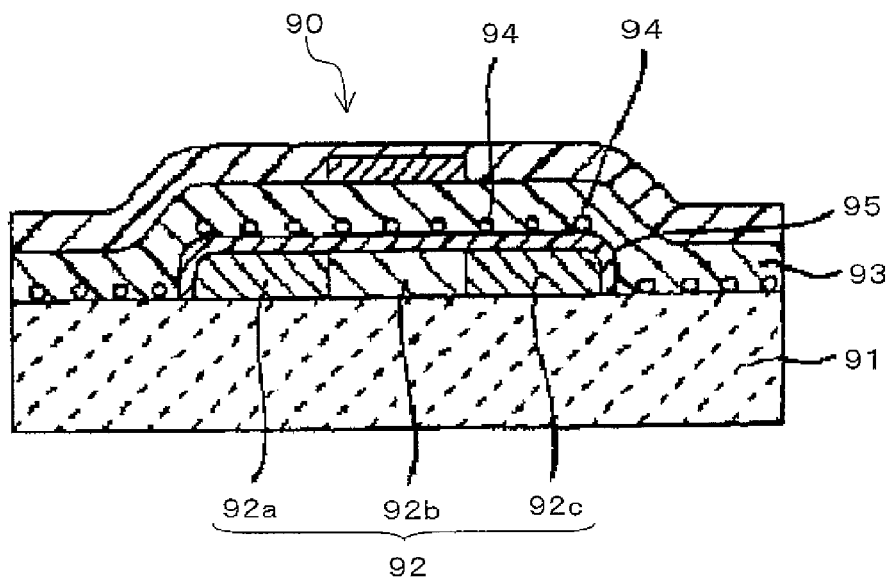
FIG. 22 is a sectional view showing a structure of a conventional semiconductor device.

Further, in order to form a light-shielding body of 50 μm or less in thickness in the formation of the light-shielding bodies 7 and 9, there is a method for forming a film of the light-shielding body using a CVD (chemical vapor deposition) method or a sputtering method. A film formation by the CVD method is suitable particularly for forming a film of 10 nm or less in thickness. Further, in order to form the light-shielding body of 50 μm or less in thickness, a light-shielding body having a low transmittance can be easily obtained by using the above-mentioned metal film. Among others, aluminum is the most suitable as a metal material. A thin film light-shielding body was formed using the aluminum, and a transmittance of the light-shielding body was measured. Employed as the method for forming a film was the CVD method in which a mixed gas of dimethyl aluminum hydride (DMAH) and hydrogen was used. A film forming time was adjusted in such a way that a film thickness is each of 0 nm (without forming a film), 3 nm, 5 nm, 10 nm, 20 nm, 50 nm, and 100 nm to prepare samples. A transmittance of the film at a wavelength of 300 to 800 nm was measured using a spectrophotometer to determine an average of the transmittances. The results of measurement are shown in FIG. 21. As is apparent from the results, even when a film thickness is 3 nm, the transmittance of the film can be lowered to 50%. Therefore, an effect of light-shielding could be achieved. Further, it is said that since an effect of light-shielding (transmittance is 20% or less) could be achieved more effectively by thickening the light-shielding body to 10 nm or more, a more effective light-shielding could be achieved. Furthermore, by thickening the light-shielding body to 50 nm or more, an effect of light-shielding can be further enhanced and transmittance becomes almost zero, and therefore the most effective light-shielding effect can be exerted.

Thus, with respect to the material and the production method for the light-shielding body, there are various cases, but the material and the production method are not particularly limited as long as the light-shielding body can achieve a desired light-shielding effect.

2. Second Embodiment

Figure 4A:
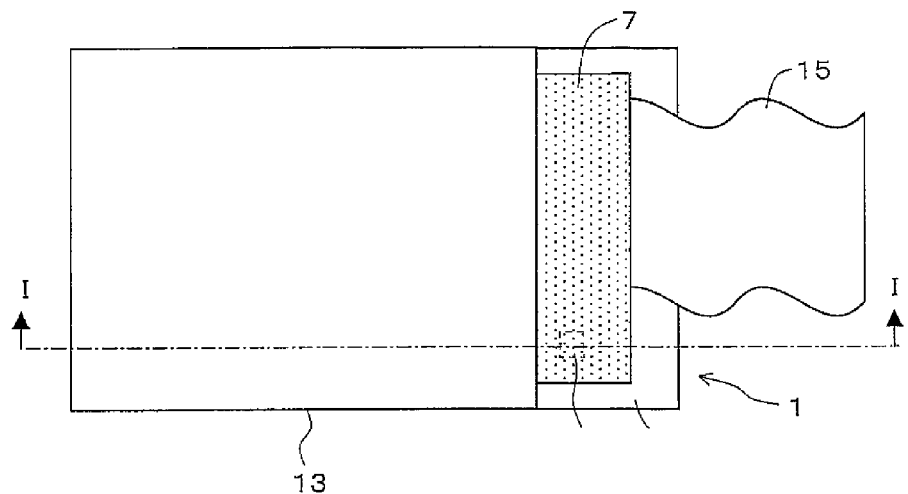
FIGS. 4A to 4C show a display device of the second embodiment of the present invention.
Figure 4B:
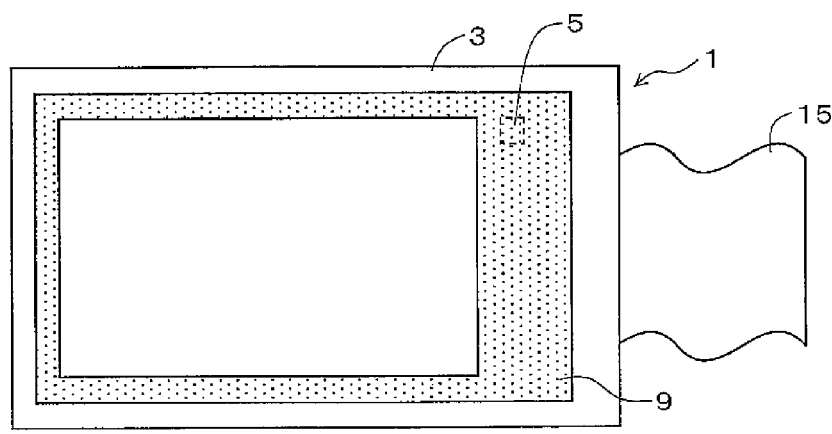
Figure 4C:
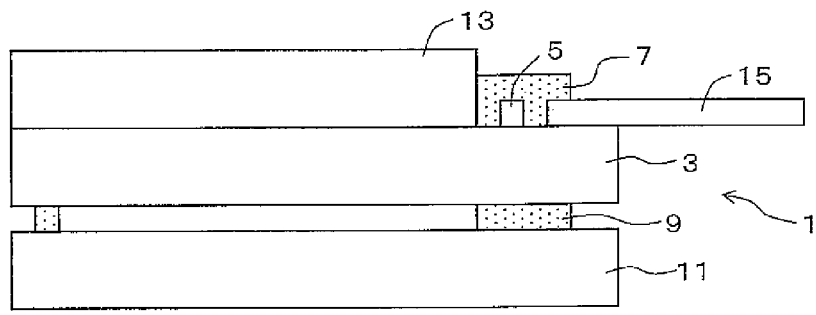

A second embodiment of the present invention will describe a display device (a liquid crystal panel module) with reference to FIGS. 4A to 4C. FIGS. 4A and 4B are a plan view and a backside view, and FIG. 4C is a sectional view taken on line I-I of FIG. 4A. In FIG. 4B, a backlight module 11 is omitted for convenience of illustration.

The display device of the second embodiment has the semiconductor device 1 of the first embodiment. A backlight module 11 is located below the insulating substrate 3, and the lower light-shielding body 9 is located between the insulating substrate 3 and the backlight module 11. An opposed substrate 13 which is located opposite to the insulating substrate 3 is located above the insulating substrate 3.

Hereinafter, constituent elements of the semiconductor device 1 will be described.

2-1. Insulating Substrate

A TFT (not shown) is formed in the form of array on the insulating substrate 3. A distributing cable (for example, a flexible printed circuit board (FPC), a flexible flat cable (FFC), etc.) 15 for sending/receiving display signals of a pixel is electrically connected to the TFT formed on the insulating substrate 3. In the second embodiment, an (MONOS-type) memory 5 and the TFT are formed on the insulating substrate 3. Both of the memory 5 and the TFT are formed by use of a thin semiconductor layer on the insulating substrate 3. The memory 5 is different from the TFT in point of having the memory holding portion 4. The memory 5 can be fabricated in the same factory as that of the TFT. Therefore, it is not necessary that the memory is retrofitted after the TFT is formed on the insulating substrate 3, and this facilitates the cost reduction and down sizing of the semiconductor device.

2-2. Backlight Module

The backlight module 11 is located below the insulating substrate 3. The backlight module 11 includes, as an example, the light source (line light sources such as a cold cathode tube and the like, point light sources such as a light-emitting diode (LED) and the like) emitting light, and the light guide plate to convert the light from the light source to a surface light source.

2-3. Opposed Substrate

The opposed substrate 13 is a substrate for applying a voltage to a whole liquid crystal sandwiched between the insulating substrate 3 and the opposed substrate 13. Further, an RGB color filter is formed on the opposed substrate 13, which can be used as a color filter substrate. In the second embodiment, the opposed substrate 13 is located not to be positioned above the memory 5.

The second embodiment employs a method in which the insulating substrate 3 is placed in a lower section and the opposed substrate 13 is bonded to the top side of the insulating substrate 3, and a constitution in which backlight is applied from the insulating substrate 3 side is used. However, the insulating substrate 3 may be placed in an upper section and the opposed substrate 13 may be placed in a lower section, and backlight may be irradiated from the opposed substrate 13 side. Since these arrangement can be modified freely by design, there is not a limitation on which substrate is placed in an upper section. Therefore, the memory can also be turned upside down including the insulating substrate and the orientation of the insulating substrate in a vertical direction is not limited. Accordingly, even though the phrases "portion above" and "portion below" in the case described below are inversed, the case can be implemented similarly and a similar effect can be achieved.

2-4. Upper Light-Shielding Body and Lower Light-Shielding Body

As an example, the upper light-shielding body 7 is a single-sided adhesive tape as shown in FIG. 3D or 3E. The upper light-shielding body 7 is bonded to the insulating substrate 3 so as to cover the memory holding portion 4 of the memory 5. In this case, the upper light-shielding body 7 is preferably pasted so as to extend continuously from a region above the distributing cable 15 to a region above the memory 5. Thereby, peeling of the distributing cable 15 can be inhibited. In addition, also when the upper light-shielding body 7 is formed by applying a coating material or a resin containing a light-shielding material, the upper light-shielding body 7 may be formed so as to extend continuously from a region above the memory holding portion 4 of the memory 5 to a region of the distributing cable. Peeling of the distributing cable 15 can also be inhibited in this case.

Further, when the frame (covering a region, in which the memory holding portion 4 is formed, of a region above the insulating substrate 3) for protecting the insulating substrate 3 is installed, it is preferable that the upper light-shielding body 7 formed of a double-sided adhesive tape as shown in FIGS. 3A to 3C is located between this frame and the insulating substrate 3 to bond the above-mentioned frame to insulating substrate 3. In this case, the upper light-shielding body 7 can undertake both roles of bonding and light-shielding.

Further, as an example, the lower light-shielding body 9 is formed of a double-sided adhesive tape as shown in FIGS. 3A to 3C. In this case, by locating the lower light-shielding body 9 between the backlight module 11 and the insulating substrate 3, the backlight module 11 can be bonded to the insulating substrate 3. In this case, the lower light-shielding body 9 can undertake both roles of bonding and light-shielding.

In the second embodiment, the necessity of limiting the thicknesses of the light-shielding bodies 7 and 9 to 1 mm or less is particularly high. A reason why the thicknesses of the light-shielding bodies 7 and 9 need to be limited to 1 mm or less is as follows. In recent years, low-profile and lighter electronic equipment is increasingly realized, and requirement for low-profile electronic parts is high. Therefore, the light-shielding body needs to be formed as thinly as possible. In consideration of thicknesses of electronic parts such as an IC chip, a distributing cable and the like surrounding the nonvolatile memory, the thickness of the light-shielding body needs to be 1 mm or less. Accordingly, by limiting the thickness of the light-shielding body to 1 mm or less, an increase in thickness of whole equipment due to installation of the light-shielding body can be inhibited.

A reason why the thickness is preferably 1 mm or less will be described taking FIG. 4C as an example. Generally, a thickness of the insulating substrate 3 or the opposed substrate 13 on which a TFT is formed is around 0.7 mm. To this, an optical film (not shown) such as a polarizing film, an optical compensation film or the like is pasted in the case of the liquid crystal display panel. Therefore, the thickness becomes close to about 1 mm. That is, a step of about 1 mm in height is produced on the opposed substrate 3. Therefore, if a single-sided adhesive tape or sheet does not have a thickness of a step height or less (1 mm or less), the adhesive tape is projected from the top side of the opposed substrate and this impairs thinning of a panel. In future, since it is predicted that a tendency of a low-profile panel is increased, the light-shielding body just have to be thinner than 1 mm.

Further, in this time, the needs for the thin tape or sheet of 1 mm or less has been described taking a thickness of the opposed substrate (including an optical film) as an example, but research and development of mounting various electronic parts in a region where the memory 5 exists is actively performed. In the case where the same tape or sheet is bonded together with these electronic parts, there is also a problem of the size/height of the electronic part, and the tape or sheet needs to become thinner to meet the size/height of the electronic part. For example, even when the height of the step of the opposed substrate is 1 mm, if the height of the electronic part is 0.9 mm, the tape or sheet needs to be 0.1 mm or less. Thus, the tape or sheet needs to be thinned in accordance with a surrounding part environment.

Further, as shown in FIG. 5, when an electronic part 3 is installed on the insulating substrate 3, the upper light-shielding body 7 preferably extends continuously from a region above the memory holding portion 4 of the memory 5 to a region of the electronic part 37. In this case, an effect of inhibiting the break of the electronic part 37 due to static electricity and an effect of light-shielding can be achieved. The electronic part 37 is, for example, IC chips, and IC chips include packaged (mold package, ceramic package) IC chips and non-packaged IC chips. In the non-packaged electronic part 37, the necessity of light-shielding is particularly large and an advantage of applying the present invention is large.

3. Third Embodiment

A third embodiment of the present invention will describe a display device with reference to FIGS. 6 and 7. FIGS. 6 and 7 are a plan view corresponding to FIG. 4A, respectively.

The display device of the third embodiment is similar to the display device of the second embodiment, but it is different from the display device of the second embodiment in that at least one of the light-shielding bodies 7 and 9 is composed of an electronic part, a distributing cable or an electronic part-mounting board. FIG. 6 shows an example in which the upper light-shielding body 7 is composed of an electronic part, and FIG. 7 shows an example in which the upper light-shielding body 7 is composed of a distributing cable.

The electronic part in FIG. 6 is an IC chip of silicon, as an example, which is a gate driver of a display pixel TFT of a panel. In FIG. 6, since the upper light-shielding body 7 composed of an electronic part is located over the memory holding portion 4 of the memory 5, light from above is not irradiated directly to the memory holding portion 4 of the memory 5. In addition, the upper light-shielding body 7 composed of an electronic part is attached to the insulating substrate 3, for example, with an anisotropic conductive film (ACF) and is electrically connected to a TFT formed on the insulating substrate 3. The upper light-shielding body 7 composed of an electronic part may be attached to the insulating substrate 3 through soldering. Further, use of the IC chip as the electronic part is not limited to use as a gate driver, but can be used as a source driver or the like. Further, the electronic part is not limited to the IC chip formed of silicon, but any electronic part can be embodied as long as the electronic part can be attached to the insulating substrate. Further, a method, in which a device obtained by forming a plurality of electronic parts on a board of polyimide is mounted on the insulating substrate 3, can also be implemented.

The distributing cable in FIG. 7 is a flexible printed circuit board (FPC), as an example, and is electrically connected to a TFT formed on the insulating substrate 3. In FIG. 7, since the upper light-shielding body 7 composed of the distributing cable is located so as to cover a region above the memory holding portion 4 of the memory 5, light from above is not irradiated directly to the memory holding portion 4 of the memory 5.

In addition, since the FPC cable is often formed of thin polyimide, it is often difficult to limit a transmittance to several percentages or less. Accordingly, the polyimide may include the above-mentioned light-shielding material. Further, since copper or the like is used for a conductive wiring portion on the FPC, the FPC may be located or a copper film pattern may be formed in such a way that this copper film is located above the memory holding portion 4 of the memory 5. Alternatively, another distributing cable such as a flexible flat cable (FFC) or the like can be used without regard to the flexible printed circuit board (FPC).

4. Fourth Embodiment

Figure 8A:
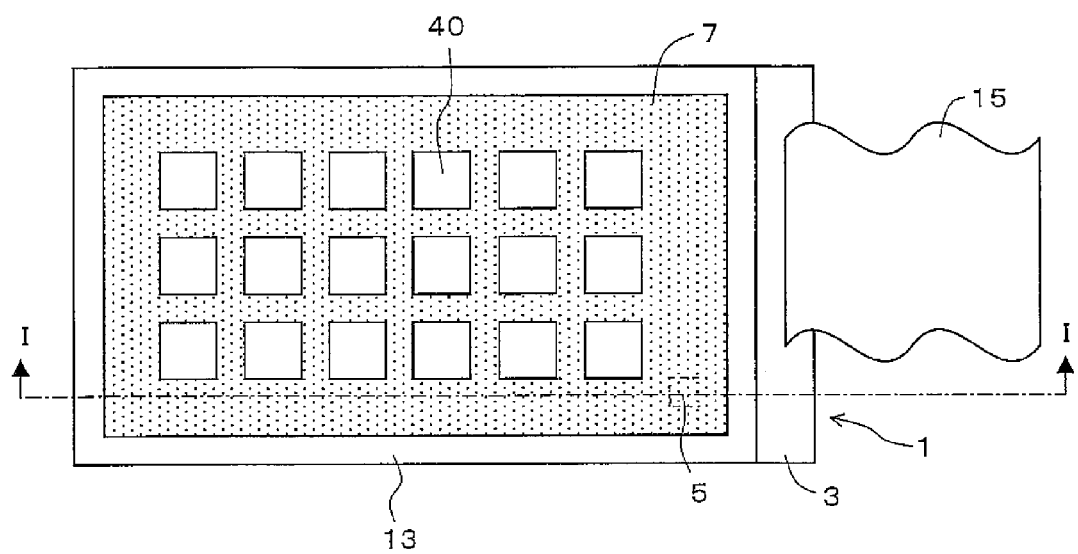
FIGS. 8A and 8B show a display device of a fourth embodiment of the present invention.
Figure 8B:
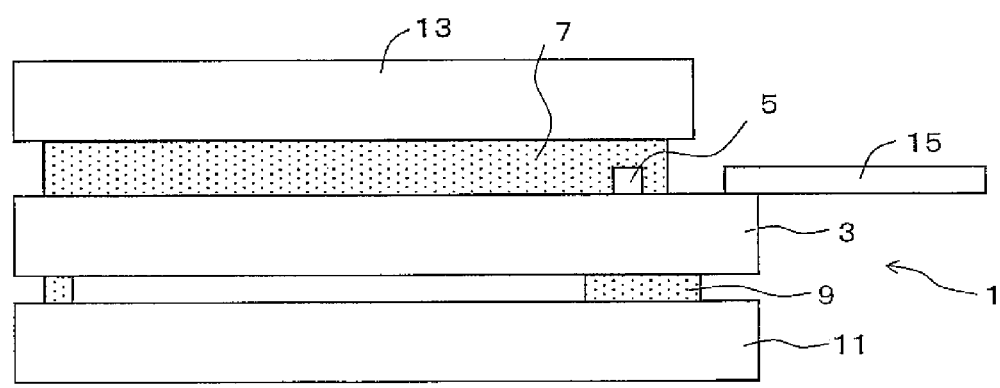

A fourth embodiment of the present invention will describe a display device with reference to FIGS. 8A and 8B. FIG. 8A is a plan view corresponding to FIG. 4A, and FIG. 8B is a sectional view taken on line I-I of FIG. 8A. Further, in FIG. 8A, a light-shielding body 7 is installed on the bottom surface of an opposed substrate 13, but the light-shielding body 7 is shown as seeing through the opposed substrate 13 for the purpose of indicating the position of it in the plan view.

The display device of the fourth embodiment is similar to the display device of the second embodiment, but it is different from the display device of the second embodiment mainly in that the opposed substrate 13 extends to a region above a memory 5 and the upper light-shielding body 7 is formed on the opposed substrate 13. The upper light-shielding body 7 is composed of, for example, a black matrix which is a frame surrounding a pixel or a dot 40 composing the pixel, or surrounding an aggregate of a pixel or a dot 40 composing the pixel.

In the constitution of the fourth embodiment, by forming the upper light-shielding body 7 on the opposed substrate 13 in advance, and then bonding the top side (surface on which the black matrix is formed) of the opposed substrate 13 to the top side (surface on which the memory or the TFT is formed) of the insulating substrate 3, the upper light-shielding body 7 can be located above the memory holding portion 4 of the memory 5.

Further, when the upper light-shielding body 7 is composed of the black matrix, the upper light-shielding body 7 has both functions of blocking light and improving a contrast.

There is also a method for forming a black matrix by processing in the photolithography and the etching processes, but it is preferable to form the black matrix using a photosensitive resin from the viewpoint of cost reduction.

5. Fifth Embodiment

Figure 9:
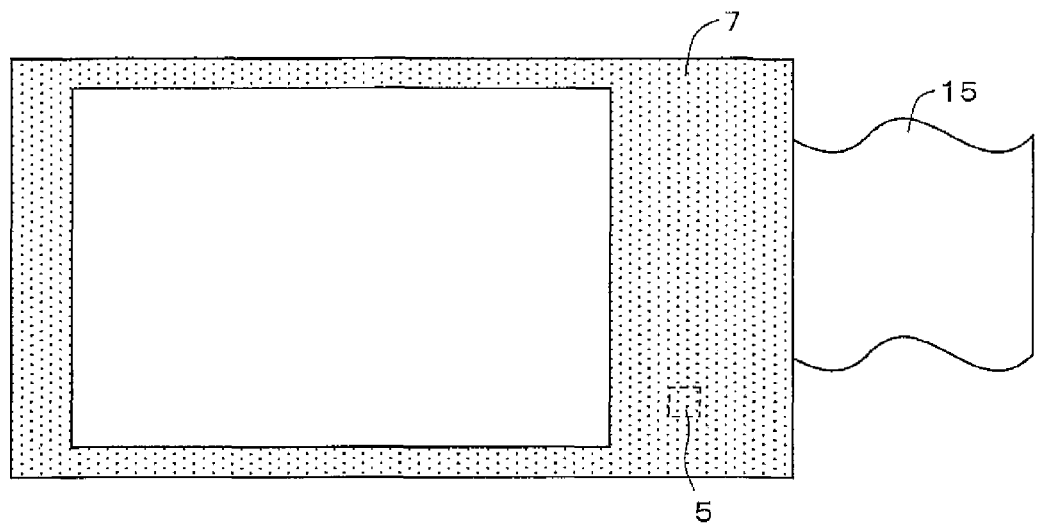
FIG. 9 is a plan view showing a structure of a display device of a fifth embodiment of the present invention and corresponding to FIG. 4A.

A fifth embodiment of the present invention will describe a display device with reference to FIG. 9. FIG. 9 is a plan view corresponding to FIG. 4A.

The display device of the fifth embodiment is similar to the display device of the second embodiment, but it is different from the display device of the second embodiment in that the upper light-shielding body 7 is composed of a frame covering a region, in which the memory holding portion 4 is formed, of a region above the insulating substrate 3.

The above-mentioned frame is, for example, a frame protecting a display panel composed of the insulating substrate 3 and the opposed substrate 13, and is generally referred to as a bezel. By locating the upper light-shielding body 7 composed of the bezel above the memory holding portion 4, it is possible to prevent the light from above from being irradiated directly to the memory holding portion 4.

Generally, the bezel is formed of a stainless alloy and has a thickness of about 0.1 mm, for example. Therefore, the bezel has high strength, and can act as a frame for protecting the display panel. Further, since the bezel is formed of a stainless alloy and has a thickness of 0.1 mm, the transmittance of the bezel becomes almost 0% to achieve an adequate effect of light-shielding. This bezel can be formed of an aluminum alloy or a titanium alloy. Further, it can also be formed of a resin/plastic, but since it is necessary to adjust the transmittance of the resin in order to use as a light-shielding body, it is preferable to use a black pigment.

6. Sixth Embodiment

Figure 10:
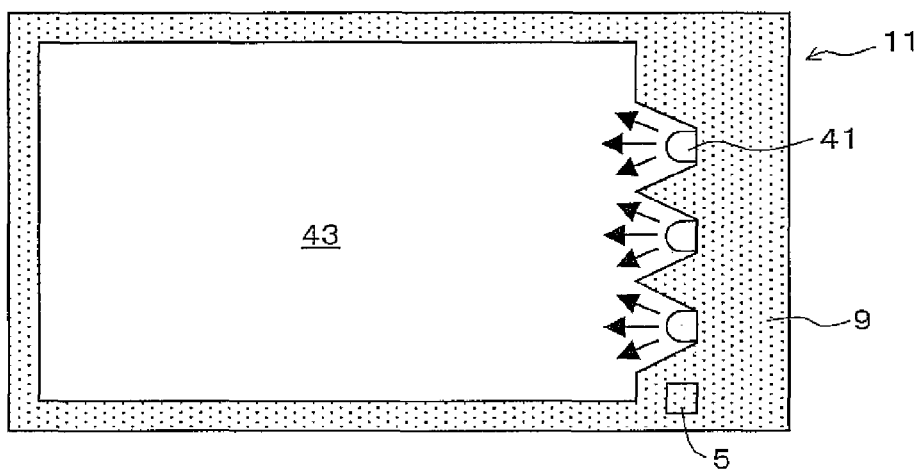
FIG. 10 is a plan view showing a structure of a display device of a sixth embodiment of the present invention and corresponding to FIG. 4A, and in FIG. 10, only a memory and a backlight module are shown for convenience of illustration.

A sixth embodiment of the present invention will describe a display device with reference to FIG. 10. FIG. 10 is a plan view corresponding to FIG. 4A. In FIG. 10, only a memory 5 and a backlight module 11 are shown for convenience of illustration.

The display device of the sixth embodiment is similar to the display device of the second embodiment, but it is different from the display device of the second embodiment in that the lower light-shielding body 9 is composed of a frame surrounding a light source 41 and a light guide plate 43.

The backlight module 11 includes the light source (line light sources such as a cold cathode tube and the like, point light sources such as a light-emitting diode (LED) and the like) 41 emitting light, and the light guide plate 43 to convert the light from the light source 41 to a surface light source. Further, the light source 41 and the light guide plate 43 are surrounded by the frame being the lower light-shielding body 9. That is, the light from the light source 41 and the light guide plate 43 is blocked by the lower light-shielding body 9 and is not irradiated directly to the memory holding portion 4 of the memory 5. The frame surrounding the light source 41 and the light guide plate 43 is sometimes referred to as a lower frame.

7. Seventh Embodiment

Figure 11:
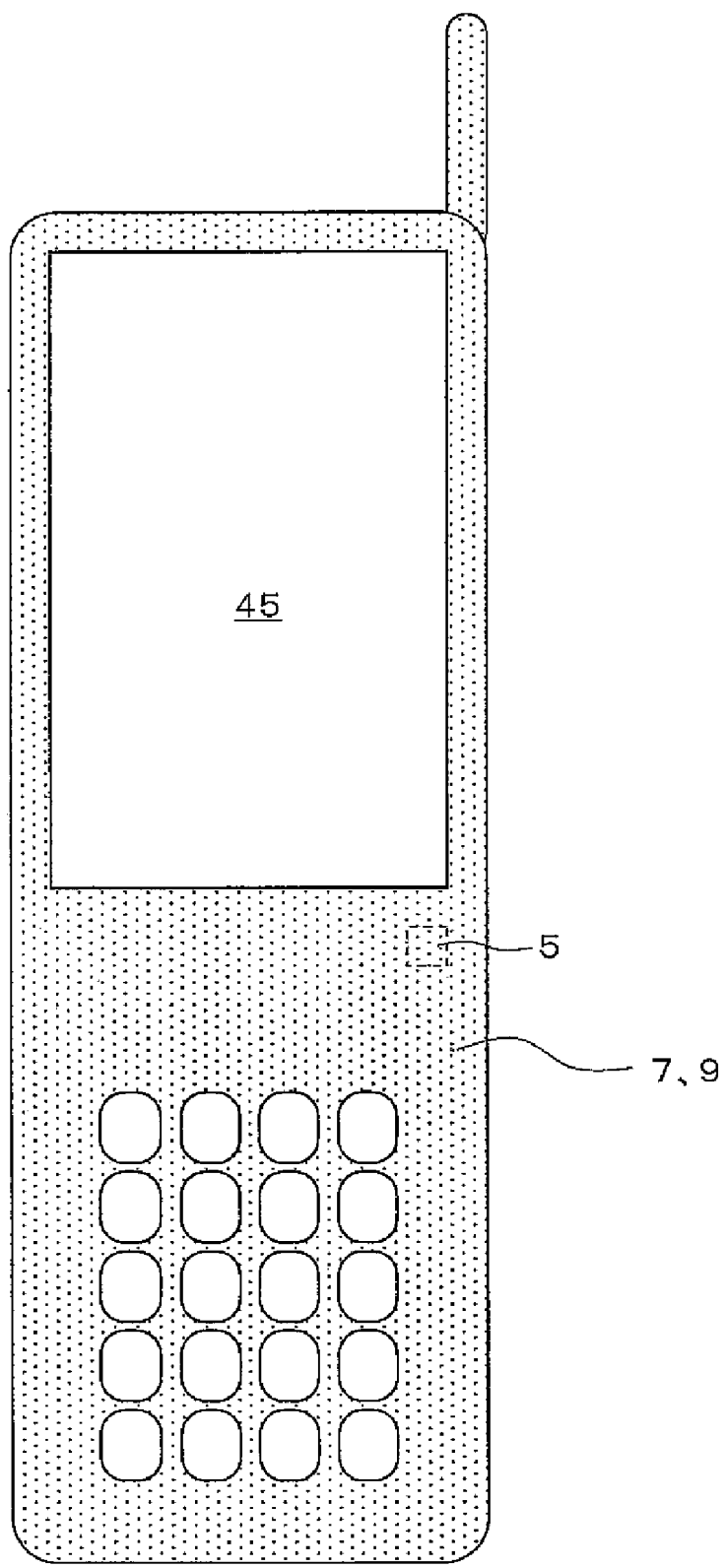
FIG. 11 is an external view showing a structure of a cell-phone of a seventh embodiment of the present invention.

A seventh embodiment of the present invention will describe a cell-phone with reference to FIG. 11. In FIG. 11, a case of the cell-phone covers portions other than a display portion 45 of the display device shown in the above-mentioned embodiment. Since the memory 5 is located in the portion covered with the case, the case of the cell-phone functions as at least one of the light-shielding bodies 7 and 9.

As for the case of the cell-phone, the case is preferably formed of a resin such as plastic, and it desirably has a thickness of 0.3 mm or more from the viewpoint of light-shielding and strength. Further, a dense colored case is preferably used.

Further, in the seventh embodiment, the cell-phone is exemplified, but the present invention can be embodied in any of information terminal equipment including a PDA, display equipment such as a personal computer monitor, liquid crystal television and the like, and a car stereo system and a car navigation system.

8. Eighth Embodiment

An eighth embodiment of the present invention corresponds to the semiconductor device 1 shown in the first embodiment that is used in a liquid crystal display device.

Figure 12A:
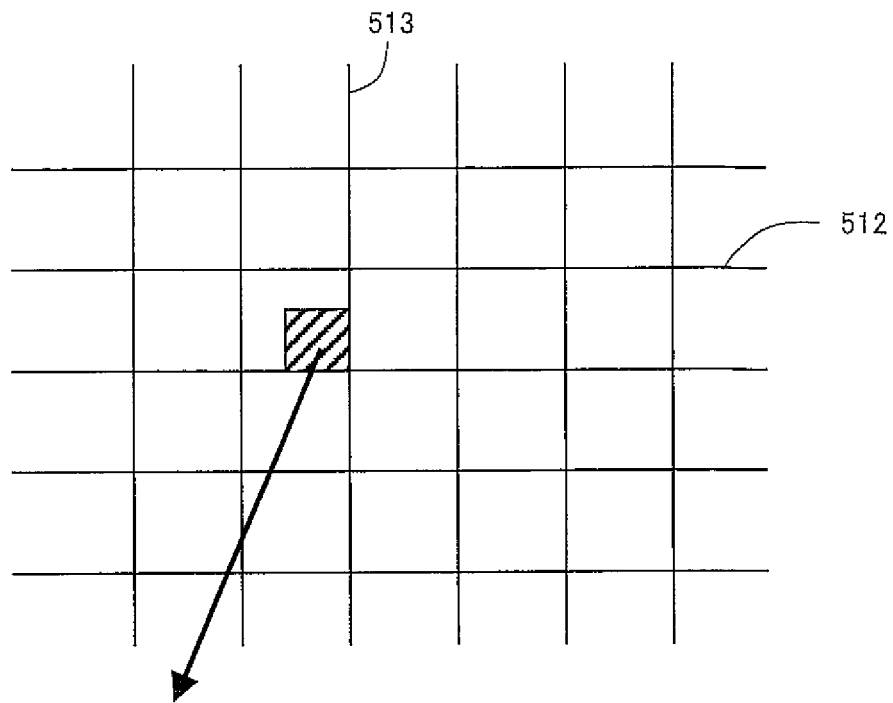
FIGS. 12A and 12B are a circuit block diagram of a liquid crystal display device of an eighth embodiment of the present invention.

The liquid crystal display device is constructed by sandwiching a liquid crystal between a pair of substrates, and a scanning line 512 and a signal line 513 are formed on one substrate as shown in FIG. 12A, and a region surrounded by the scanning line 512 and the signal line 513 is designated as a pixel, and a drive circuit to selectively drive a pixel electrode corresponding to this one pixel is provided. Each pixel electrode is located opposite to an opposed electrode formed on the other substrate with a liquid crystal interposed between these electrodes and selectively drives one pixel.

The eighth embodiment is characterized by forming the semiconductor device 1 shown in the first embodiment on a panel substrate of the liquid crystal display device. In this case, the semiconductor device 1 of the present invention is used as a device to accumulate image information which is provided for a voltage generation circuit to apply an voltage to an opposed electrode of the liquid crystal display device.

Figure 12B:
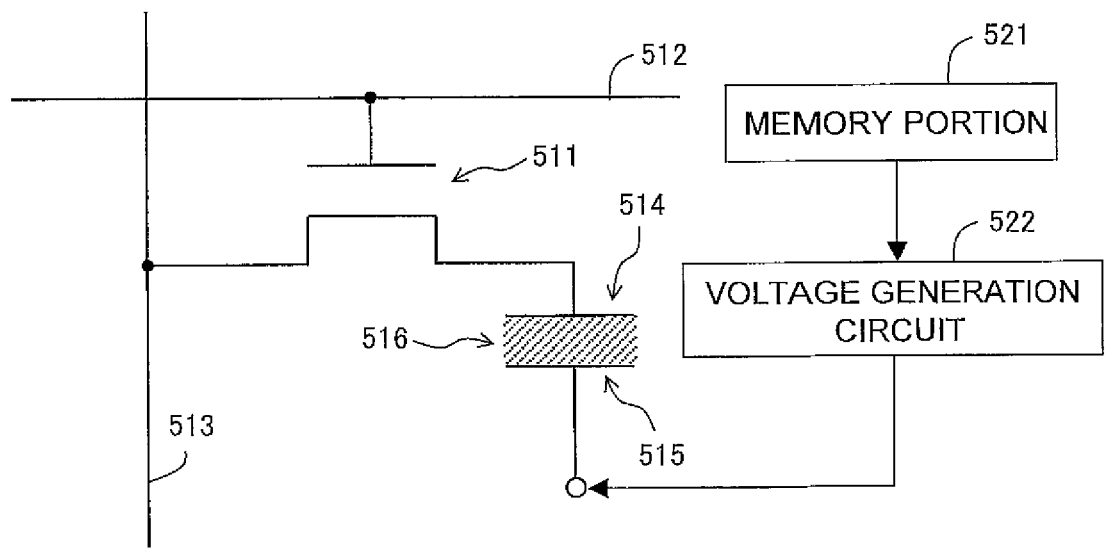

More specifically, as shown in FIG. 12B, the scanning line 512 is connected to a gate electrode of a pixel TFT 511 and the signal line 513 is connected to one diffusion region of the pixel TFT 511 and a pixel electrode 514 is connected to the other diffusion region. The pixel electrode 514 is located opposite to an opposed electrode 515 which is common to a panel with a liquid crystal 516 interposed between these electrodes. A predetermined voltage generated by a voltage generation circuit 522 is applied to the opposed electrode 515. The voltage generated by the voltage generation circuit 522 is determined based on image information stored in a memory portion 521 including the semiconductor device 1 of the present invention.

The voltage generated in the voltage generation circuit 522 is applied to the opposed electrode 515 in order to inhibit flicker in screen, and this voltage value should be adjusted for every panel. This voltage adjustment is generally performed by adjusting a variable resistor externally attached to a panel. By including the semiconductor device 1 of the first embodiment of the present invention, costs of an external part itself and costs of installation of the external part can be reduced. Further, since automation of adjustment becomes easy, an inspection cost can be reduced. Furthermore, the semiconductor device 1 of the present invention is advantageous for cost reduction because the gate insulating film has a simple structure, and therefore, the required number of processes for producing the gate insulating film is few.

9. Ninth Embodiment

A ninth embodiment of the present invention is a display device including the semiconductor device 1 shown in the first embodiment. Examples of the display device include a liquid crystal panel, an organic EL panel and the like.

This display device is characterized by further including a voltage output circuit provided on a panel substrate, the voltage output circuit outputting a voltage defined by digital information which is inputted into the voltage output circuit to the opposed electrode, and a DA converter provided on the panel substrate, the DA converter converting digital tone data to analogue tone signals, and characterized by storing in the above-mentioned semiconductor device 1 of the first embodiment data to specify the correlation between the digital tone data and a voltage of the analogue tone signals.

Figure 13:
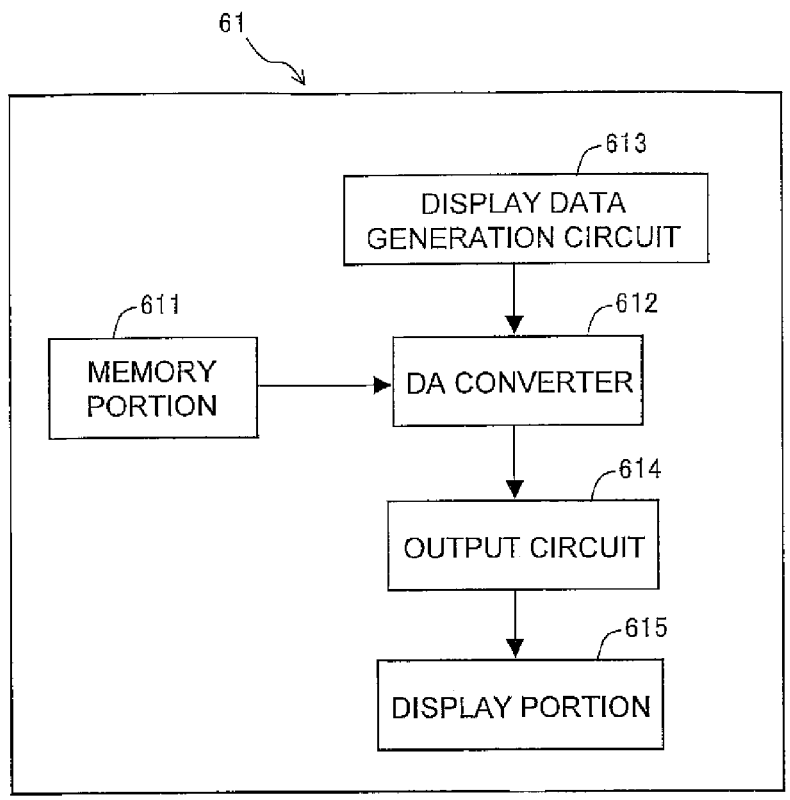
FIG. 13 is a circuit block diagram of a display device of a ninth embodiment of the present invention.

More specifically, as shown in FIG. 13, a display device 61 includes a display data generation circuit 613, and the display data generation circuit 613 sends display data of a digital signal to a DA converter 612. The DA converter 612 converts the display data of digital signals to analogue signals and sends these analogue signals to a display portion 615 through an output circuit 614. In this time, it is necessary to adjust the correlation between digital tone data and a voltage of an analogue tone signal in the DA converter 612 so that color of images displayed in the display portion is reproduced naturally. This correlation should be adjusted for every pane. The correlation between the digital tone data and the voltage of the analogue tone signal is stored in a memory portion 611 including the semiconductor device 1 of the present invention The correlation between the digital tone data and the voltage of the analogue tone signal is generally stored in a nonvolatile memory chip externally attached to a panel. By including the semiconductor device 1 of the present invention, costs of an external part itself and costs of installation of the external part can be reduced. Further, since automation of adjustment becomes easy, an inspection cost can be reduced. Furthermore, the semiconductor device 1 of the present invention is advantageous for cost reduction because the gate insulating film has a simple structure, and therefore, the required number of processes for producing the gate insulating film is few.

10. Tenth Embodiment

A tenth embodiment of the present invention is a receiver including a display device including the semiconductor device 1 shown in the first embodiment, and is characterized by forming a display device, and a receiving circuit to receive image signals, a image signal circuit to supply image signals received by the receiving circuit to the display device and the above-mentioned semiconductor device 1 for storing data required for generating the image signals on a panel substrate of the display device.

Figure 14:
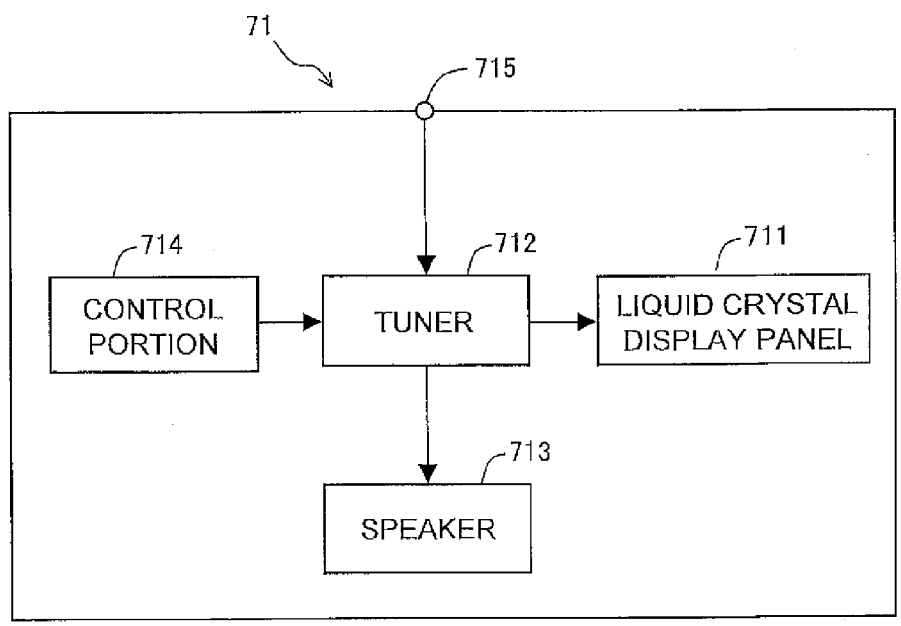
FIG. 14 is a constitutional diagram of a receiver of a tenth embodiment of the present invention.

Specifically, as shown in FIG. 14, the receiver 71 includes a display device (a liquid crystal display panel) 711, a tuner 712, a speaker 713, a control portion 714, and an antenna terminal 715. FIG. 14 shows a system of receiving wireless signals with an antenna, but when signals are received with a wired system, an antenna terminal is replaced with a cable connection terminal and a tuner is replaced with a signal receiving portion. A display device 711 includes the semiconductor device 1 of the present invention. A voltage value to be output to an opposed electrode of a liquid crystal panel and the correlation between digital tone data and a voltage of an analogue tone signal can be stored in the nonvolatile memory included in this display device 711. Furthermore, encrypted signals are sent to the display device, and ciphers is resolved in the display panel, and thereby information security can be enhanced, but a cipher key in this case can be stored in the semiconductor device 1 in the display device. By including such the display device, inexpensive and sophisticated receiver can be realized.

11. Others

As described above, various methods of light-shielding can be implemented. However, when it is difficult from the viewpoint of transmittance or diffraction of light to block light just with one light-shielding body for maintaining the performance of memory, a plurality of light-shielding bodies may be formed. Thereby, a light-shielding body exhibiting a desired effect of light-shielding can be prepared. For example, there is a method in which the light-shielding body of a sheet or a tape is installed on a light-shielding body formed of a resin. Combination of the plurality of light-shielding bodies can be selected freely in consideration of design constraints in commercialization. By having such a structure in which a plurality of light shielding bodies are stacked, an effect of light-shielding can be enhanced.

Various characteristics shown in embodiments described above can be combined with one another. If one embodiment includes a plurality of characteristics, one of the plurality of characteristics or plural characteristics appropriately extracted from these characteristics can be employed separately or in combination in the present invention.

12. Experiment of Verifying Effect

Next, experiments to verify an effect of installing the lower light-shielding body 9, an effect of setting a protrusion degree of the lower light-shielding body 9 at 0.1 or more, and an effect of installing the upper light-shielding body 7 will be described.

12-1. Experiment 1: Effect of Installing Lower Light-Shielding Body

Experiments to investigate the effect of installing the lower light-shielding body 9 were carried out. A semiconductor device 1 shown in FIG. 15 was used for the experiments. A nonvolatile memory having an MONOS structure was used as the memory 5. As the transmittance of the lower light-shielding body 9, 17% and 50% were selected. Further, experiments were carried out without installing the lower light-shielding body 9, and the resulting data is taken as data in the case where the transmittance of the lower light-shielding body 9 is 100%. The transmittance of the lower light-shielding body 9 was changed by changing the content of the light-shielding material in the lower light-shielding body 9.

The transmittance of the lower light-shielding body 9 was measured under the following conditions.

Figure 15:
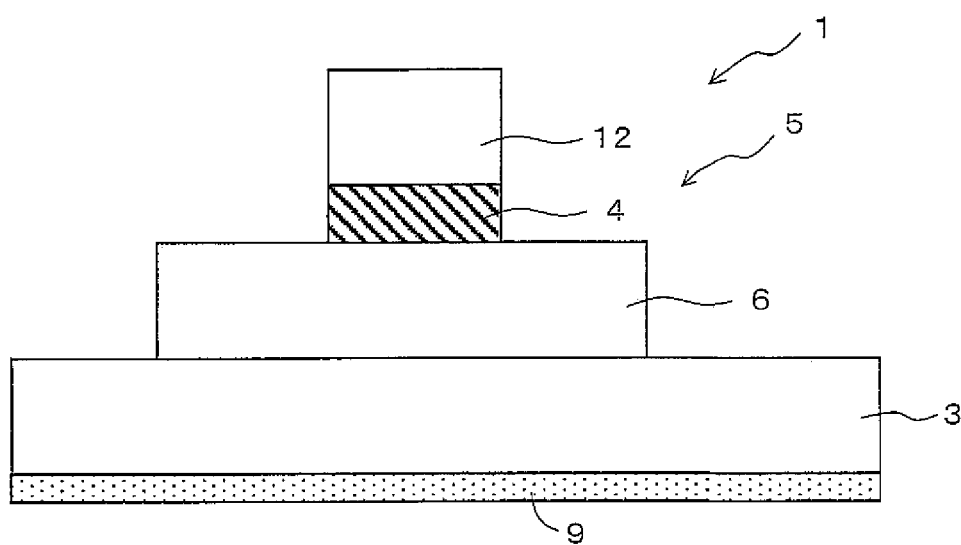
FIG. 15 is a sectional view showing a structure of a semiconductor device used in Experiment 1 of Experiment of verifying effect of the present invention.
Figure 16:
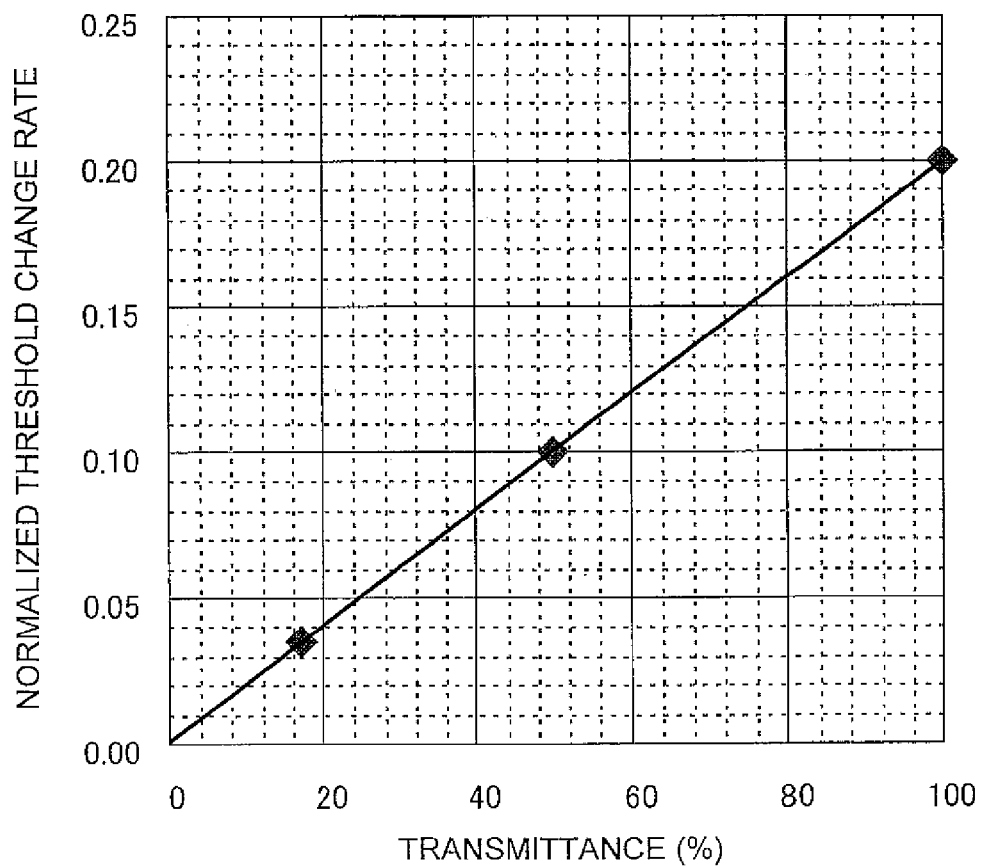
FIG. 16 is a graph showing a relationship between the transmittance and the normalized threshold change rate showing the results of Experiment 1 of Experiment of verifying effect of the present invention.

Measuring apparatus: spectrophotometer U-4100 manufactured by Hitachi Ltd.
  Starting wavelength: 700 nm
  Ending wavelength: 300 nm
  Scanning speed: 300 nm/min
  Sampling interval: 0.50 nm
  Slit: 5.00 nm The normalized threshold change rate at the time when the semiconductor device 1 in FIG. 15 is irradiated with light having luminous intensity of 1000 candelas from a backlight for 1 hour from the lower light-shielding body 9 side was evaluated. The results of evaluations are shown in FIG. 16.

The backlight used in Experiment 1 is a type using a light source of an LED, and light of the LED is guided and spread to a plane by a light guide plate. This spread light is adjusted to planar uniform light with less irregularity by a diffusing sheet. This diffusing sheet is positioned above the light guide plate. A prismatic sheet referred to as a lens film is installed above the diffusing sheet. This prismatic sheet does not ineffectually spread light outward, and irradiates light to a front direction by aligning the orientation of light to a front direction. Thereby, the back light is arranged so that a large quantity of planar light with less irregularity in a vertical direction can be extracted. This arrangement is the same as that of usual backlights used in liquid crystal displays Here, the meaning of the normalized threshold change rate will be described below.

The memory used for evaluation changes a threshold by the application of a voltage to discriminate a memory state as with an ordinary MONOS-type memory. Therefore, when light is applied onto the memory, a threshold deserving a memory state changes. "Normalized threshold change rate" is a parameter expressing the extent to which the threshold observed is returned (changed) a by light irradiation when an amount, by which the threshold is shifted by the application of a voltage, is normalized as 1. For example, in a p-type memory device, when the threshold is −1 V before the application of a voltage and the threshold becomes +9 V after the application of a voltage, the threshold change rate is 10 V. Since this change rate produces errors in some degree due to the variations of characteristic of the memory device, the threshold change rates are all normalized as 1 even though the threshold change rate is 9.5 V or is 10.5 V. The normalized threshold change rate expresses the extent to which the threshold is returned (changed) from the normalized value "1" by light irradiation.

When the threshold is changed by light irradiation, the threshold is returned from +9 V toward −1 V side (direction) before the application of a voltage. For example when the threshold is returned to +4 V, an amount of shift is 5 V (+9 V minus +4 V) and this amount is a half of 10 V which is the threshold change rate due to the application of a voltage, and therefore a value of the normalized threshold change rate is 0.5. The normalized threshold change rate of 0 represents that there is no change from a state after the application of a voltage, and the normalized threshold change rate of 0.2 represents that there is a change of 20% from a state after the application of a voltage.

Referring to FIG. 16, it is found that the normalized threshold change rate becomes smaller as the transmittance of the lower light-shielding body 9 is decreased. This result means that by installing the lower light-shielding body 9, a problem of losing memory information hardly arises.

12-2. Experiment 2: Effect of Setting Protrusion Degree of Lower Light-Shielding Body at 0.1 or More Next, experiments to investigate the effect of setting the protrusion degree of the lower light-shielding body 9 at 0.1 or more were carried out. A semiconductor device 1 shown in FIG. 17 was used for the experiments. A nonvolatile memory having an MONOS structure was used as the memory 5. The transmittance of the lower light-shielding body 9 was 0.1% or less.

Figure 17:
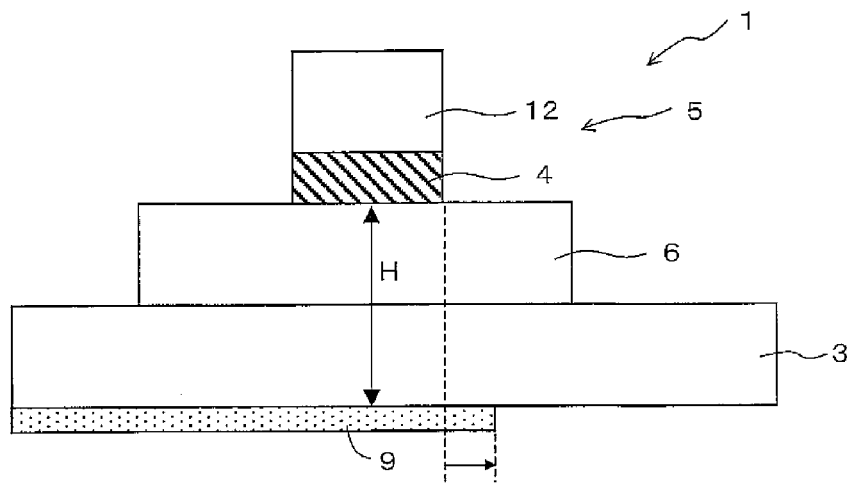
FIG. 17 is a sectional view showing a structure of a semiconductor device used in Experiment 2 of Experiment of verifying effect of the present invention.

The length L of the protrusion of the lower light-shielding body 9 was changed to −0.17, 0, 0.08, 0.33, 0.58, 0.83, and 2.08 mm. The minus value means that in FIG. 17, a position of the right end of the lower light-shielding body 9 is positioned on the left side of a dotted line. In addition, when a length (a length in a lateral direction in the drawing) of the memory holding portion 4 of FIG. 17 is 0.001 mm and a minute length compared with a length of the protrusion of the light-shielding body 9 and a length L of the protrusion is −0.17 mm, the memory holding portion 4 becomes a fully exposed state.

The distance H between the light-shielding body 9 and the memory holding portion 4 was kept at 0.7 mm. The protrusion degree of the light-shielding body 9 is determined by the protrusion length L/distance H.

Other conditions are the same as in Experiment 1, and the normalized threshold change rate was evaluated. The results of evaluations are shown in FIG. 18.

Figure 18:
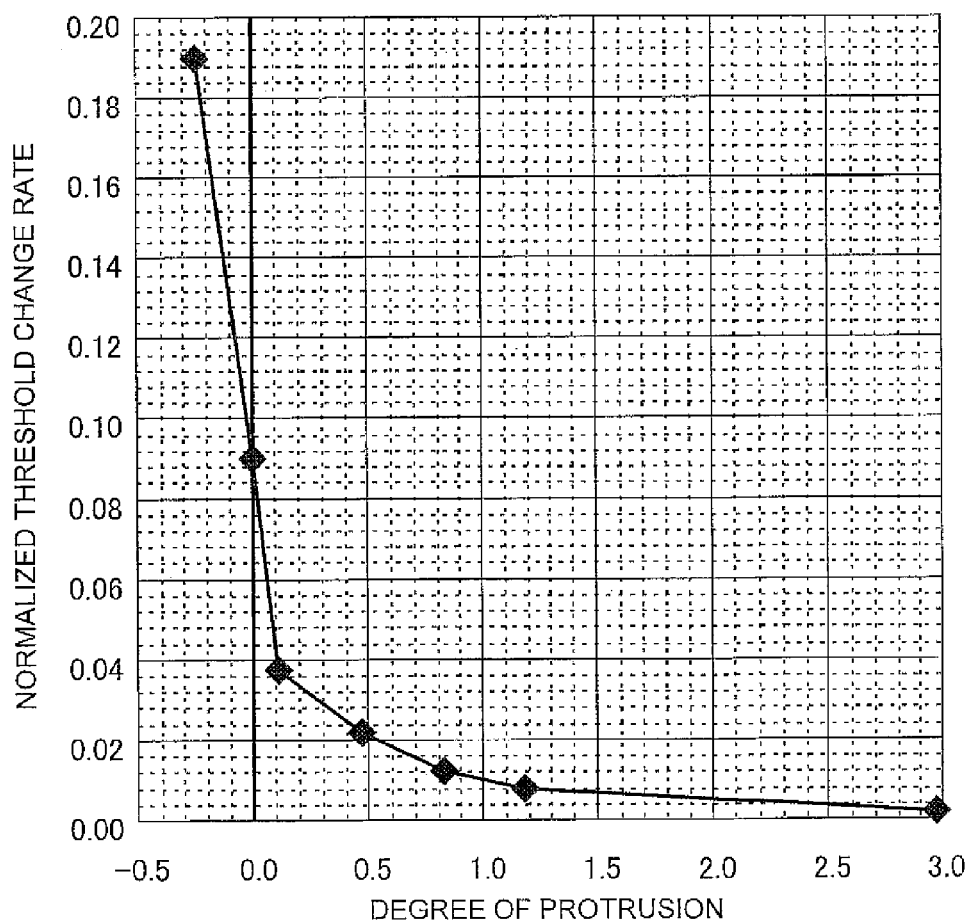
FIG. 18 is a graph showing a relationship between a protrusion degree and the normalized threshold change rate showing the results of Experiment 2 of Experiment of verifying effect of the present invention.

According to FIG. 18, it is found that in the vicinity of the protrusion degree of −0.25, the normalized threshold change rate is about 0.19, and this is nearly equal to that at the transmittance of 100% of FIG. 16. When the protrusion degree is 0, the normalized threshold change rate is about 0.09, and therefore the threshold change rate can be reduced by more than half since an effect of light-shielding is exerted and this is an effect of light-shielding by the light-shielding body 9.

Further, when the protrusion degree is 0.1, the normalized threshold change rate is reduced to about 0.04, and the threshold change rate is reduced to one-half or less that in the case where the protrusion degree is 0. This shows that by increasing the protrusion degree to 0.1 or more, an effect of installing the light-shielding body 9 extremely increases.

When the protrusion degree is further increased, the normalized threshold change rate is decreased further, but as is apparent from FIG. 18, the normalized threshold change rate differs largely between a region of the protrusion degree of 0.1 or more and a region of less than 0.1, and it was found that 0.1 is a critical value.

Further, it is conceivable that this holds true for the upper light-shielding body 7.

However, a value of the normalized threshold change rate varies with the protrusion degree also in a range of the protrusion degree of 0.1 or more. If a further effect of light-shielding is needed, by setting the protrusion degree at 0.5 or more, the normalized threshold change rate can be reduced to about one-tenth and therefore a better effect of light-shielding can be achieved. Furthermore, when the protrusion degree is set at 1.0 or more, the normalized threshold change rate can be reduced to about one-twentieth and therefore a better effect of light-shielding can be achieved. Further, when an extremely large effect of light-shielding is needed, when the protrusion degree is set at 3.0 or more, the normalized threshold change rate can be brought closer to 0 and this case is the best.

12-3. Experiment 3: Effect of Installing Upper Light-Shielding Body

Figure 19:
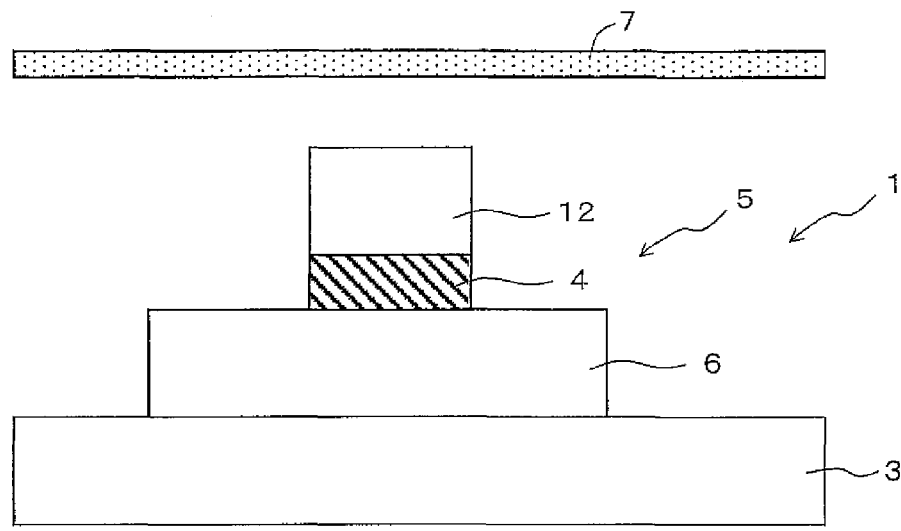
FIG. 19 is a sectional view showing a structure of a semiconductor device used in Experiment 3 of Experiment of verifying effect of the present invention.

Experiments to investigate the effect of installing the upper light-shielding body 7 were carried out. A semiconductor device 1 shown in FIG. 19 was used for the experiment.

In this experiment, (clear weather, direct light without passing through a window glass) the semiconductor device 1 was irradiated with solar light from the upper light-shielding body 7 side in place of the backlight.

Other conditions are the same as in Experiment 1, and the normalized threshold change rate was evaluated. The results of evaluations are shown in FIG. 20.

Figure 20:
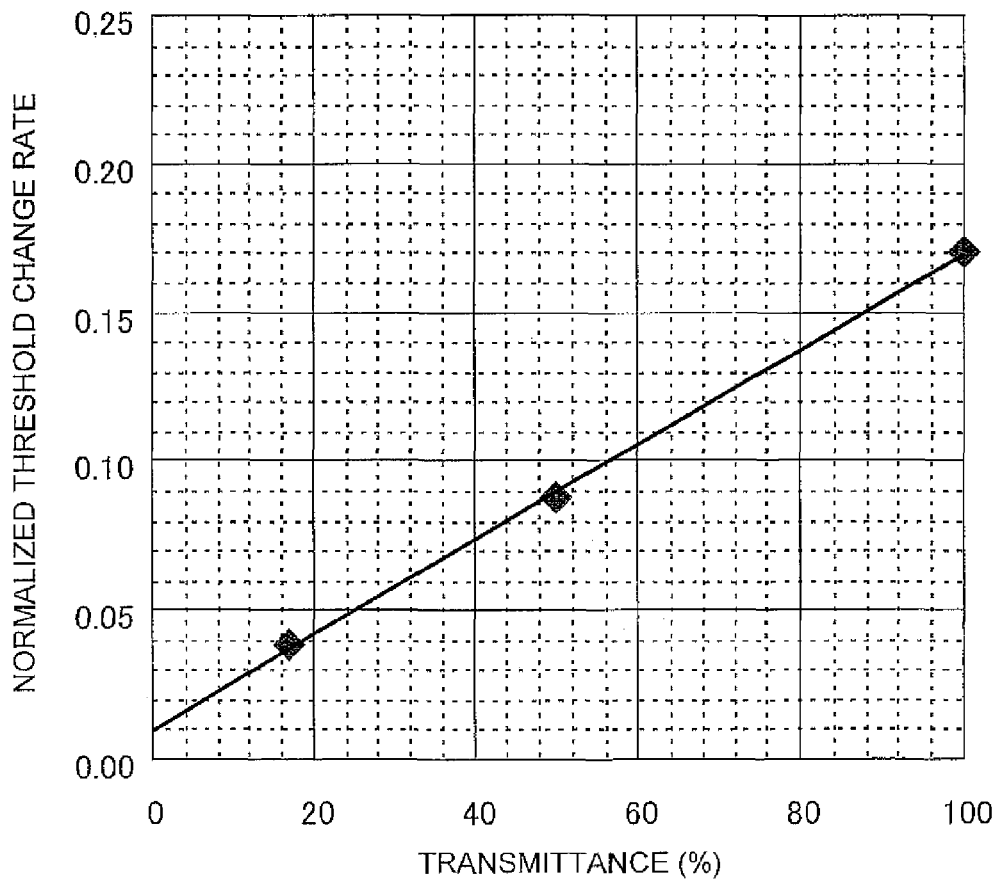
FIG. 20 is a graph showing a relationship between the transmittance and the normalized threshold change rate showing the results of Experiment 3 of Experiment of verifying effect of the present invention.

Referring to FIG. 20, when the transmittance of a lateral is 100% (without the light-shielding body), the normalized threshold change rate is about 0.17, and the threshold change rate was nearly equal to Experiment 1.

Accordingly, it was found that light from the side opposite to the backlight also has an effect on the memory holding characteristic of the memory. In this time, the experiment was performed with solar light. However, when intense light is applied, such an effect is exerted Further, with respect to a sample in which a light-shielding body with the transmittance of 50% was installed above the memory, the normalized threshold change rate was about 0.09, and this case also exhibited the threshold change rate nearly equal to Experiment 1. When a light-shielding body having the transmittance of 17% was installed, the normalized threshold change rate was about 0.04, and this case also exhibited the threshold change rate nearly equal to Experiment 1.

Thus, it is found that the normalized threshold change rate becomes smaller as the transmittance of the upper light-shielding body 7 is decreased. This result means that by installing the upper light-shielding body 7, a problem of losing memory information hardly arises. From previous experiments, it was known that a lower light-shielding film on the backlight side is important, but from further experiments of this time, it was experimentally verified that light-shielding on the opposite side (light of interior illumination or exterior solar light) is important. Therefore, it was verified that, when the present memory is used in an environment of using a cell-phone or the like outdoors, or is used in an environment in which solar light is incident and the memory is irradiated with light even indoors, or s used in a very bright environment even indoors, a light-shielding body against light emitted (irradiated) from these environments described above can becomes necessary for the side opposite to the backlight.

What is claimed is:

1. A semiconductor device comprising:
an insulating substrate;
a nonvolatile memory formed above said insulating substrate and having a memory holding portion;
a backlight module formed above or below said insulating substrate; and
at least one light-shielding body covering an upper side, an under side, or both sides of said memory holding portion, wherein
at least one of said at least one light-shielding body is installed in such a way that a protrusion degree of said light-shielding body, which is defined by (a length of the light-shielding body protruded from the memory holding portion)/(a distance between the light-shielding body and the memory holding portion), is from 0.1 to 3; and
at least one of said at least one light-shielding body is located between said insulating substrate and said backlight module.

2. The semiconductor device according to claim 1, wherein the device includes at least two light-shielding bodies said light-shielding bodies are respectively installed above and below said memory holding portion.

3. The semiconductor device according to claim 2, wherein the device includes at least two light shielding bodies and said light-shielding bodies installed above and below said memory holding portion are installed in such a way that each protrusion degree of the light-shielding bodies is 0.1 or more.

4. The semiconductor device according to claim 1, wherein said at least one light-shielding body is 3 nm to 1 mm in thickness.

5. The semiconductor device according to claim 1, wherein said nonvolatile memory is of a charge holding type.

6. The semiconductor device according to claim 1, wherein at least one of said at least one light-shielding body is formed of a tape or a sheet.

7. The semiconductor device according to claim 1, further comprising a frame covering a region in which said memory holding portion is formed, the region being at least one of regions which are respectively located above and below said insulating substrate, wherein
at least one of said at least one light-shielding body is formed of a tape or a sheet, and
said light-shielding body formed of the tape or the sheet is located between said insulating substrate and said frame.

8. The semiconductor device according to claim 1, further comprising at least one of an electronic part and a distributing cable, on said insulating substrate, wherein
at least one said at least one light-shielding body is formed of a tape or a sheet, and
said light-shielding body formed of the tape or the sheet extends continuously from a region above said memory holding portion to a region above at least one of said electronic part and said distributing cable.

9. The semiconductor device according to claim 1, further comprising an opposed substrate which is located above or below said insulating substrate, and located opposite to said insulating substrate, wherein
at least one of said at least one light-shielding body is located on said opposed substrate.

10. The semiconductor device according to claim 9, wherein at least one of said at least one light-shielding body is composed of a black matrix.

11. The semiconductor device according to claim 9, wherein at least one of said at least one light-shielding body is formed of a photosensitive resin.

12. The semiconductor device according to claim 1, wherein at least one of said at least one light-shielding body is formed by use of a coating material or a resin.

13. The semiconductor device according to claim 12, wherein said coating material or said resin includes a silicon resin.

14. The semiconductor device according to claim 1, wherein at least one of said at least one light-shielding body includes a black pigment, and
said black pigment includes at least one selected from the group consisting of carbon black, graphite, copper oxide, manganese dioxide, aniline black, perylene black, titanium black, cyanine black, activated carbon, ferrite, magnetite, chromium oxide, iron oxide, molybdenum disulfide, chromium complex, composite oxide-type black dye and anthraquinone-type organic black dye.

15. The semiconductor device according to claim 1, wherein at least one of said at least one light-shielding body is composed of an electronic part, a distributing cable or an electronic part-mounting board.

16. The semiconductor device according to claim 1, wherein at least one of said at least one light-shielding body is composed of a frame covering a region in which said memory holding portion is formed, the region being at least one of regions which are respectively located above and below said insulating substrate.

17. The semiconductor device according to claim 1, wherein said nonvolatile memory is contained in a case, and
at least one of said at least one light-shielding body is composed of said case.

18. The semiconductor device according to claim 1, wherein at least one of said at least one light-shielding body has a structure in which a plurality of light-shielding bodies are stacked on each other.

19. The semiconductor device according to claim 1, further comprising a TFT formed on said insulating substrate.

20. A display device including the semiconductor device according to claim 19.

21. The display device according to claim 20, wherein gamma correction values or voltage correction values of an electrode of an opposed substrate are stored in said nonvolatile memory.

22. A mobile device including said display device according to claim 20.

23. A semiconductor device comprising:
an insulating substrate;
a nonvolatile memory formed above said insulating substrate and having a memory holding portion
a backlight module formed above or below said insulating substrate; and
at least one light-shielding body covering an upper side, an under side, or both sides of said memory holding portion, wherein
said at least one light-shielding body is installed in such a way that a protrusion degree of said light-shielding body, which is defined by (a length of the light-shielding body protruded from the memory holding portion)/(a distance between the light-shielding body and the memory holding portion), is from 0.1 to 3,
said at least one light-shielding body is formed of a tape or a sheet, and
said light-shielding body formed of the tape or the sheet is located between said insulating substrate and said backlight module.

24. A semiconductor device comprising:
an insulating substrate;
a nonvolatile memory formed above said insulating substrate and having a memory holding portion; and
at least one light-shielding body covering an upper side, an under side, or both sides of said memory holding portion, wherein
at least one of said at least one light-shielding body is installed in such a way that a protrusion degree of said light-shielding body, which is defined by (a length of the light-shielding body protruded from the memory holding portion)/(a distance between the light-shielding body and the memory holding portion), is from 0.1 to 3; and, at least one said at least one light-shielding body is composed of a frame surrounding a light-emitting part or a light-guide part of a backlight module.

* * * * *